(12) United States Patent
Spory

(10) Patent No.: US 10,115,645 B1
(45) Date of Patent: *Oct. 30, 2018

(54) REPACKAGED RECONDITIONED DIE METHOD AND ASSEMBLY

(71) Applicant: Erick Merle Spory, Colorado Springs, CO (US)

(72) Inventor: Erick Merle Spory, Colorado Springs, CO (US)

(73) Assignee: Global Circuit Innovations, Inc., Colorado Springs, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/865,328

(22) Filed: Jan. 9, 2018

(51) Int. Cl.
| | |
|---|---|
| *H01L 21/48* | (2006.01) |
| *H01L 21/02* | (2006.01) |
| *H01L 23/26* | (2006.01) |
| *H01L 23/10* | (2006.01) |
| *H01L 23/20* | (2006.01) |

(Continued)

(52) U.S. Cl.
CPC .......... *H01L 23/26* (2013.01); *H01L 21/4803* (2013.01); *H01L 23/10* (2013.01); *H01L 23/20* (2013.01); *H01L 23/49513* (2013.01); *H01L 23/49838* (2013.01); *H01L 24/03* (2013.01); *H01L 24/83* (2013.01); *H01L 24/85* (2013.01); *H01L 24/98* (2013.01); *H01L 2224/838* (2013.01)

(58) Field of Classification Search
CPC ............... H01L 21/485; H01L 21/4853; H01L 21/4864; H01L 21/4875; H01L 21/4889; H01L 21/4892; H01L 21/02079
See application file for complete search history.

(56) References Cited

U.S. PATENT DOCUMENTS 3,969,813 A * 7/1976 Minetti .............. H05K 13/0486
  156/765
4,012,832 A * 3/1977 Crane .................... H01L 24/32
  252/514

(Continued)

FOREIGN PATENT DOCUMENTS

WO WO2011-101262 A1 8/2011

OTHER PUBLICATIONS

Getters—molecular scavengers for packaging, Dr. Ken Gilleo and Steve Corbett, HDI Jan. 2001, www.hdi-online.com, 4 pages.

(Continued)

Primary Examiner — David A Zarneke
(74) Attorney, Agent, or Firm — Thomas J. Lavan

(57) ABSTRACT

A method is provided. The method includes one or more of removing one or more existing ball bonds from an extracted die, reconditioning die pads of the extracted die to create a reconditioned die, securing the reconditioned die within a cavity of a new package base, providing a plurality of bond connections interconnecting the reconditioned die pads and package leads or downbonds of the new package base, applying an encapsulating compound over the reconditioned die and the plurality of bond connections to create an assembled package base, and securing a lid to the new package base. Reconditioning includes applying a plurality of metallic layers to the die pads of the extracted die, the extracted die including a fully functional semiconductor die removed from a previous package. The encapsulating compound is configured to exhibit low thermal expansion.

20 Claims, 18 Drawing Sheets

(51) Int. Cl.
*H01L 23/495* (2006.01)
*H01L 23/00* (2006.01)
*H01L 23/498* (2006.01)

(56) References Cited

U.S. PATENT DOCUMENTS

| | | | |
|---|---|---|---|
| 4,426,769 | A | 1/1984 | Grabbe |
| 4,622,433 | A | 11/1986 | Frampton |
| 5,064,782 | A | 11/1991 | Nishiguchi |
| 5,219,794 | A | 6/1993 | Satoh |
| 5,243,756 | A | 9/1993 | Hamburgen et al. |
| 5,517,127 | A | 5/1996 | Bergeron |
| 5,598,031 | A | 1/1997 | Groover et al. |
| 5,783,464 | A | 7/1998 | Burns |
| 5,783,868 | A | 7/1998 | Galloway |
| 5,847,467 | A | 12/1998 | Wills |
| 5,936,758 | A | 8/1999 | Fisher et al. |
| 6,100,108 | A | 8/2000 | Mizuno et al. |
| 6,100,581 | A | 8/2000 | Wakefield et al. |
| 6,169,331 | B1 | 1/2001 | Manning |
| 6,429,028 | B1 * | 8/2002 | Young ............... H01L 21/56 257/E21.502 |
| 6,472,725 | B1 | 10/2002 | Stroupe |
| 7,759,800 | B2 | 7/2010 | Rigg et al. |
| 7,883,880 | B1 | 2/2011 | Davila et al. |
| 7,972,683 | B2 * | 7/2011 | Gudeman ........... B81C 1/00269 156/379.9 |
| 8,421,227 | B2 | 4/2013 | Lin |
| 9,711,480 | B2 * | 7/2017 | Spory ............... H01L 24/49 |
| 9,824,948 | B2 * | 11/2017 | Spory ............... H01L 23/20 |
| 9,870,968 | B2 * | 1/2018 | Spory ............... H01L 23/10 |
| 9,935,028 | B2 * | 4/2018 | Spory ............... H01L 23/20 |
| 9,966,319 | B1 * | 5/2018 | Spory ............... H01L 23/04 |
| 2001/0019176 | A1 | 9/2001 | Ahiko et al. |
| 2002/0084528 | A1 | 7/2002 | Kim et al. |
| 2002/0182782 | A1 | 12/2002 | Farnworth |
| 2003/0127423 | A1 | 7/2003 | Dlugokecki |
| 2004/0006150 | A1 | 1/2004 | Murray et al. |
| 2004/0040855 | A1 | 3/2004 | Batinovich |
| 2004/0056072 | A1 | 3/2004 | Chapman et al. |
| 2005/0057883 | A1 | 3/2005 | Bolken |
| 2005/0085578 | A1 | 4/2005 | Iguchi |
| 2005/0285250 | A1 | 12/2005 | Jeong |
| 2006/0068595 | A1 | 3/2006 | Seliger et al. |
| 2006/0166406 | A1 | 7/2006 | Lin |
| 2007/0007661 | A1 | 1/2007 | Burgess |
| 2007/0259470 | A1 | 11/2007 | Quenzer et al. |
| 2007/0295456 | A1 | 12/2007 | Gudeman |
| 2008/0124547 | A1 | 5/2008 | O et al. |
| 2008/0197469 | A1 | 8/2008 | Yang et al. |
| 2008/0230922 | A1 | 9/2008 | Mochizuki |
| 2009/0151972 | A1 | 6/2009 | Potter |
| 2009/0160047 | A1 | 6/2009 | Otsuka |
| 2009/0184407 | A1 * | 7/2009 | Arvin ............... H01L 21/56 257/678 |
| 2010/0007367 | A1 | 1/2010 | Spielberger et al. |
| 2010/0079035 | A1 | 4/2010 | Matsuzawa et al. |
| 2010/0140811 | A1 | 6/2010 | Leal et al. |
| 2010/0200262 | A1 | 8/2010 | Mahapatra et al. |
| 2010/0246152 | A1 | 9/2010 | Lin et al. |
| 2010/0314754 | A1 | 12/2010 | Zhang |
| 2011/0215449 | A1 | 9/2011 | Camacho et al. |
| 2011/0298137 | A1 | 12/2011 | Pagaila et al. |
| 2012/0177853 | A1 | 7/2012 | Gruenwald |
| 2012/0217643 | A1 | 8/2012 | Pagaila |
| 2013/0207248 | A1 | 8/2013 | Bensoussan et al. |
| 2014/0252584 | A1 | 9/2014 | Spory |
| 2016/0181168 | A1 | 6/2016 | Spory |
| 2016/0181171 | A1 | 6/2016 | Spory |
| 2016/0225686 | A1 | 8/2016 | Spory |

OTHER PUBLICATIONS

Cookson Group Staydry SD1000 High Temperature Moisture Getter data sheet, Cookson Group, May 30, 2011, 1 page.
Wikipedia "Getter", retrieved May 30, 2011, http://en.wikipedia.org/wiki/Getter.
Wikipedia "Kirkendall effect", retrieved Jul. 5, 2011, http://en.wikipedia.org/wiki/Kirkendall effect.
Flip Chips dot com, Tutorial 72—Mar. 2007, Redistribution Layers, article by George A. Riley, PhD, Flipchips dot com website, downloaded Dec. 18, 2011: http://www.flipchips.com/tutorial72.html.
MIT article "Liquid Metal Printer Lays Electronic Circuits on Paper, Plastic, and even Cotton", downloaded from MIT Technology Review Nov. 22, 2013, http://www.technologyreview.com/view/521871/liquid-metal-printer-lays-electronic-circuits-on-paper-plastic-and-even-cotton/.
sPRO 125 and sPRO 250 Direct Metal SLM Production Printer datasheet, 3DSystems, Part No. 70743, Issue Date Apr. 10, 2012.
Wikipedia "3D Printing" reference, downloaded Jan. 12, 2015.
Wikipedia "Screen printing" reference, downloaded Jan. 12, 2015.
Wikipedia "Ball Bonding", downloaded Apr. 11, 2016.
Solid State Technology "The back-end process: Step 7—Solder bumping step by step", by Deborah S. Patterson, http://electroiq.com/blog/2001/07/the-back-end-process-step-7-solder-bumping-step-by-step/, downloaded Apr. 11, 2016.
Official Action for U.S. Appl. No. 13/623,603, dated Dec. 9, 2014.
Official Action for U.S. Appl. No. 13/623,603, dated Apr. 16, 2015.
Official Action for U.S. Appl. No. 13/623,603, dated Aug. 14, 2015.
Official Action for U.S. Appl. No. 13/623,603, dated Apr. 29, 2016.
Official Action for U.S. Appl. No. 13/623,603, dated Aug. 24, 2016.
Official Action for U.S. Appl. No. 13/623,603, dated Apr. 11, 2017.
Official Action for U.S. Appl. No. 13/785,959, dated Jan. 5, 2015.
Official Action for U.S. Appl. No. 13/785,959, dated Apr. 16, 2015.
Official Action for U.S. Appl. No. 14/142,823, dated Jan. 5, 2015.
Official Action for U.S. Appl. No. 14/142,823, dated May 11, 2015.
Official Action for U.S. Appl. No. 14/142,823, dated Oct. 9, 2015.
Official Action for U.S. Appl. No. 14/142,823, dated Feb. 29, 2016.
Official Action for U.S. Appl. No. 14/142,823, dated Jul. 28, 2016.
Official Action for U.S. Appl. No. 14/142,823, dated Mar. 17, 2017.
Official Action for U.S. Appl. No. 14/565,626, dated Aug. 28, 2015.
Official Action for U.S. Appl. No. 14/600,691, dated Aug. 10, 2015.
Official Action for U.S. Appl. No. 14/600,691, dated Feb. 19, 2016.
Official Action for U.S. Appl. No. 14/600,691, dated Jul. 29, 2016.
Official Action for U.S. Appl. No. 14/600,691, dated Dec. 27, 2016.
Notice of Allowance for U.S. Appl. No. 14/600,691, dated Jun. 6, 2017.
Official Action for U.S. Appl. No. 14/600,733, dated Apr. 17, 2015.
Official Action for U.S. Appl. No. 14/600,733, dated Sep. 9, 2015.
Official Action for U.S. Appl. No. 14/600,733, dated May 9, 2016.
Official Action for U.S. Appl. No. 14/600,733, dated Aug. 23, 2016.
Official Action for U.S. Appl. No. 14/600,733, dated Dec. 2, 2016.
Notice of Allowance for U.S. Appl. No. 14/600,733, dated Oct. 5, 2017.
Official Action for U.S. Appl. No. 15/088,822, dated Mar. 24, 2017.
Notice of Allowance for U.S. Appl. No. 15/088,822, dated Aug. 15, 2017.

* cited by examiner

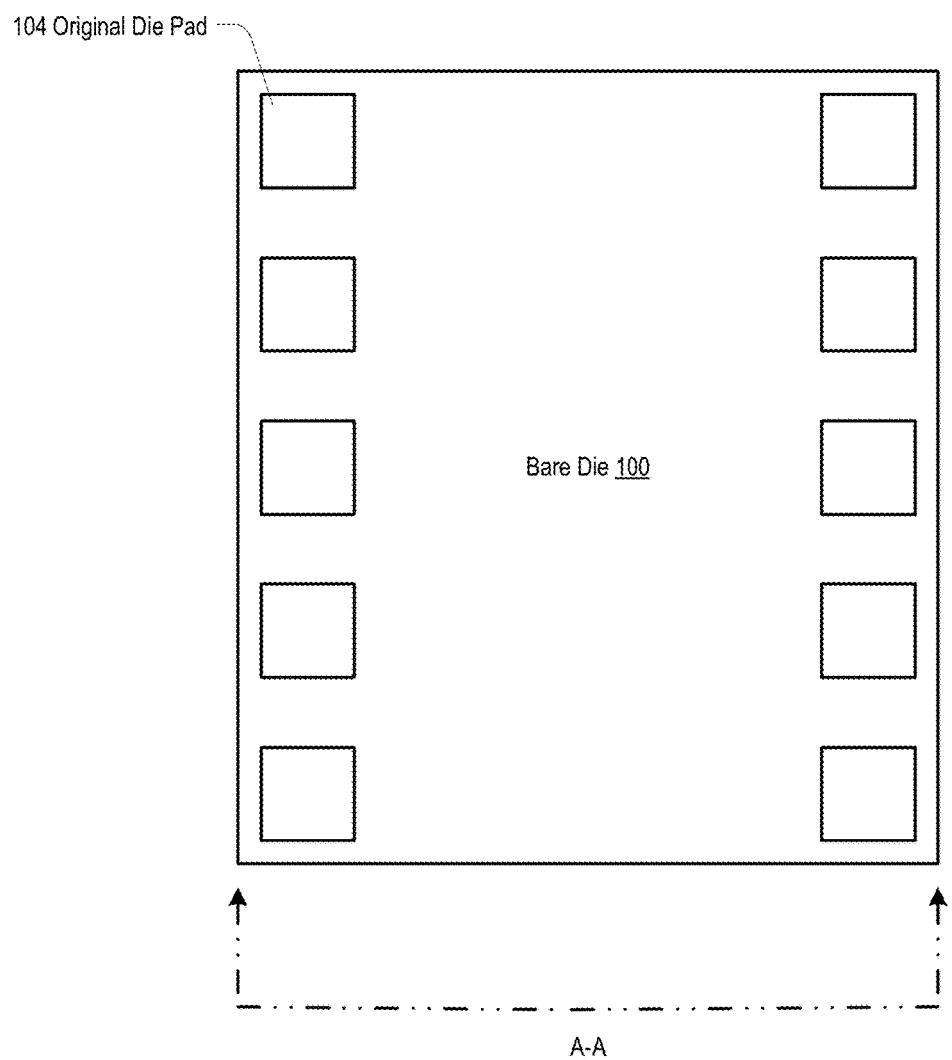

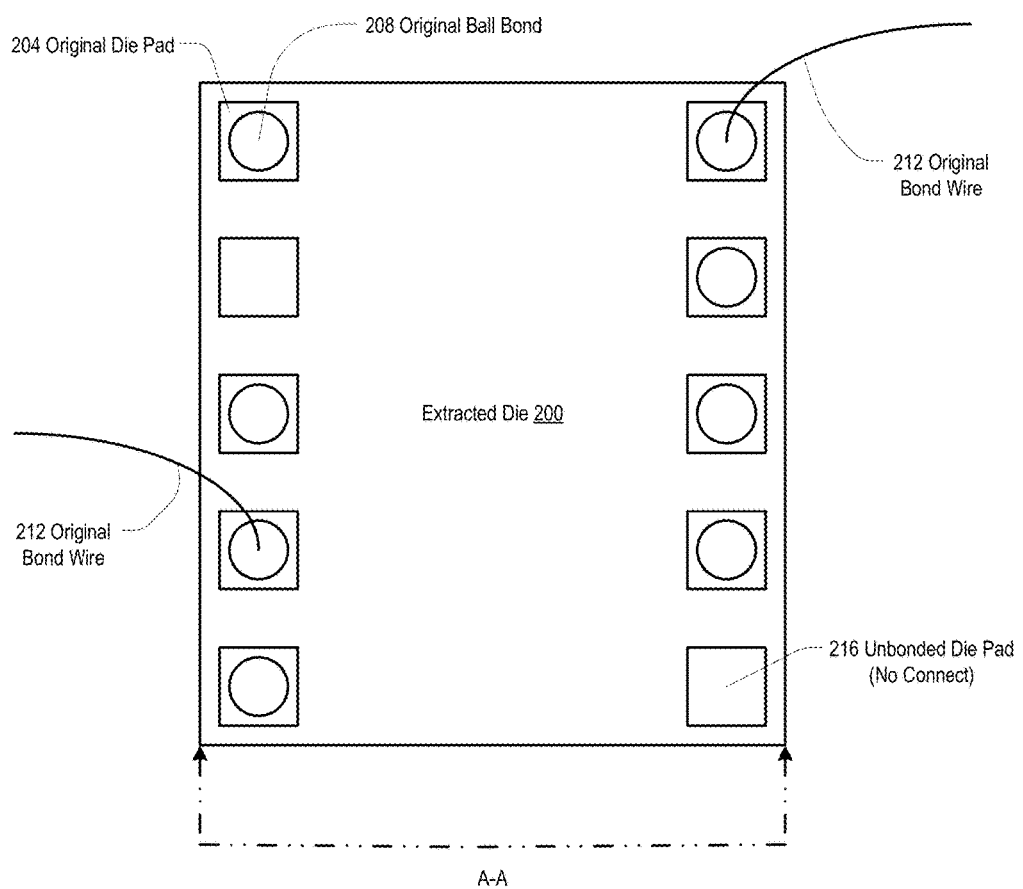
Fig. 2 Extracted Die with Bond Pads, Ball Bonds, and Bond Wires

*Fig. 3A Extracted Die Section A-A*
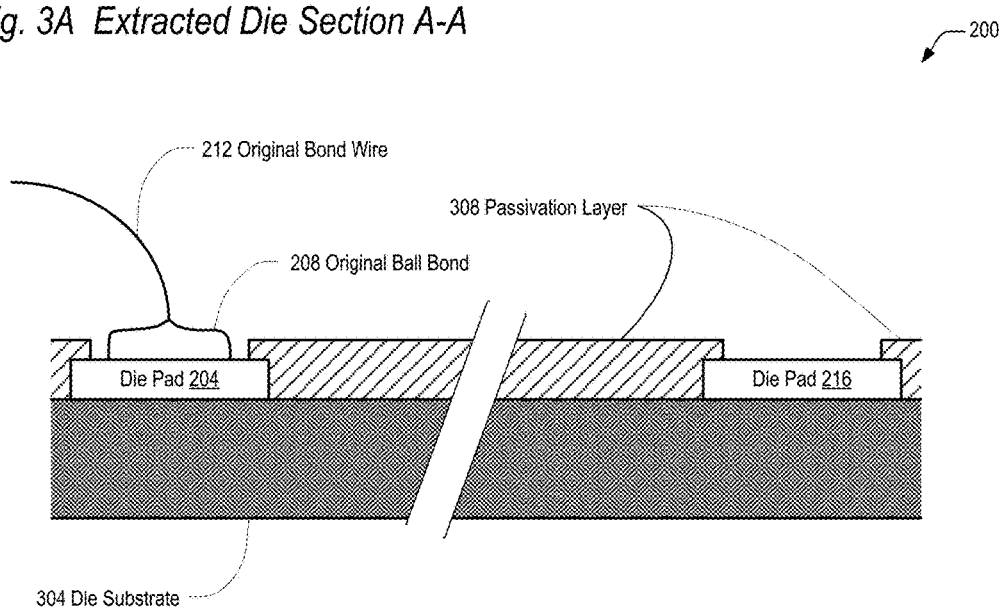
*Fig. 3B Modified Extracted Die Section A-A After Original Ball Bond and Original Bond Wire Removal*
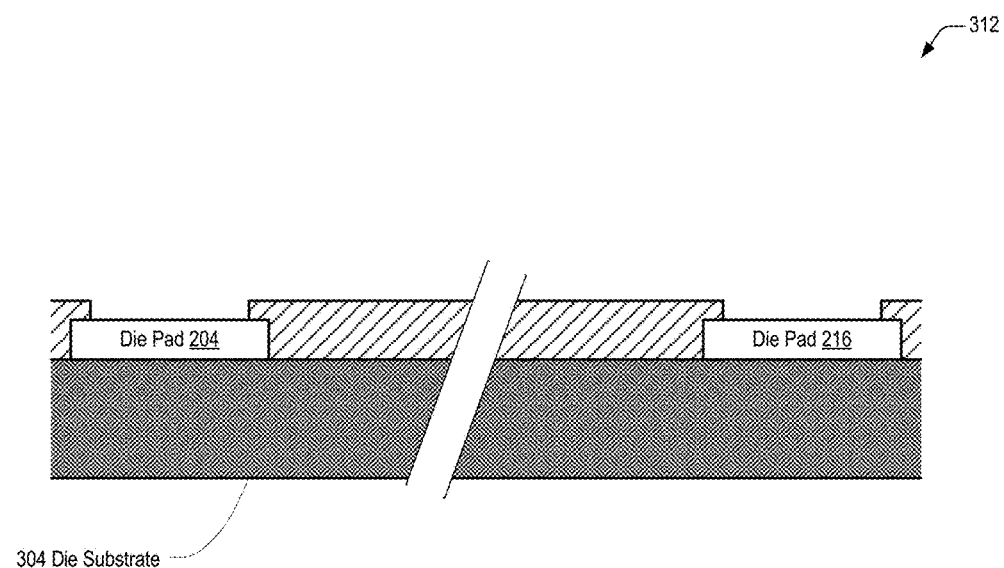

Fig. 3C  Electroless Nickel Layer Application Section A-A
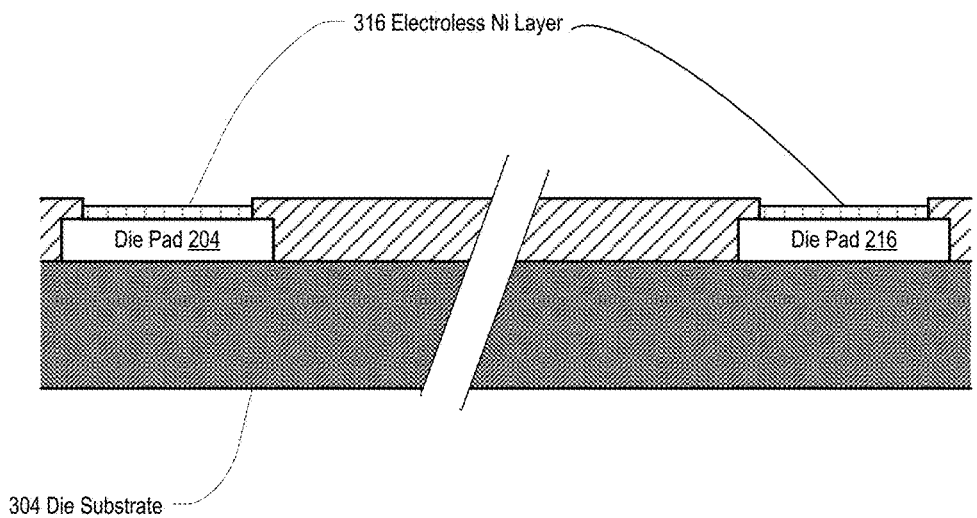
Fig. 3D  Electroless Palladium Layer Section A-A
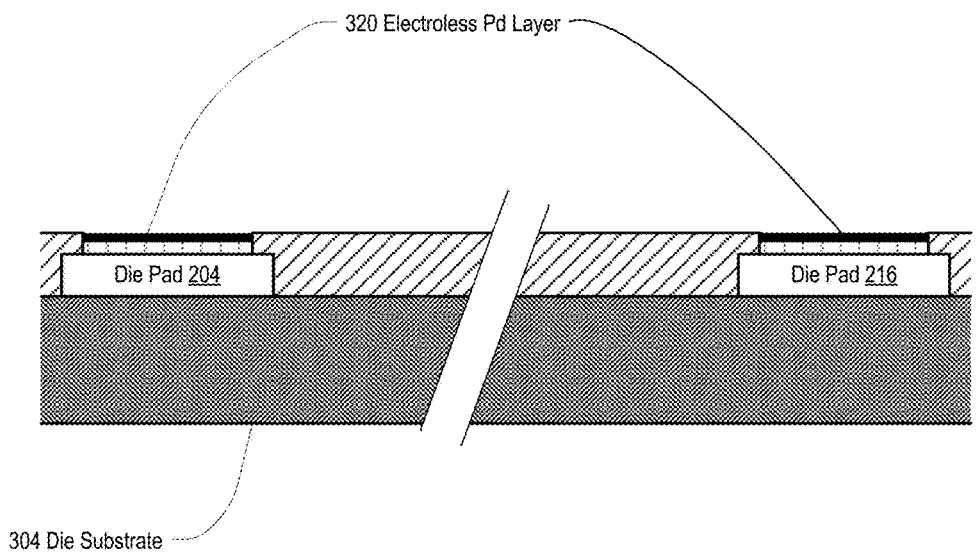

Fig. 3E Immersion Gold Layer Application Section A-A
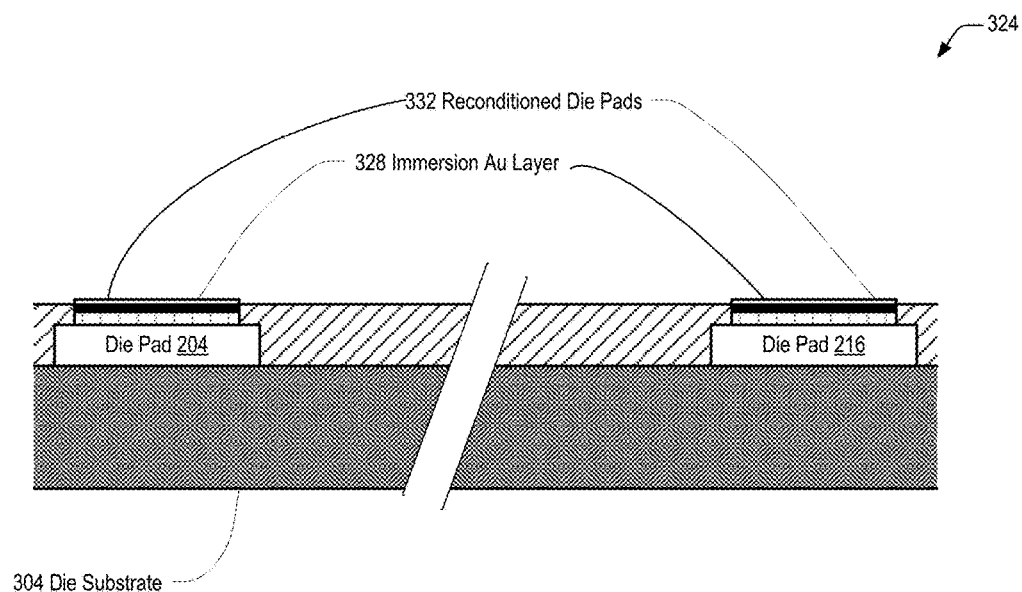
Fig. 3F Reconditioned Die after New Ball Bonding Section A-A
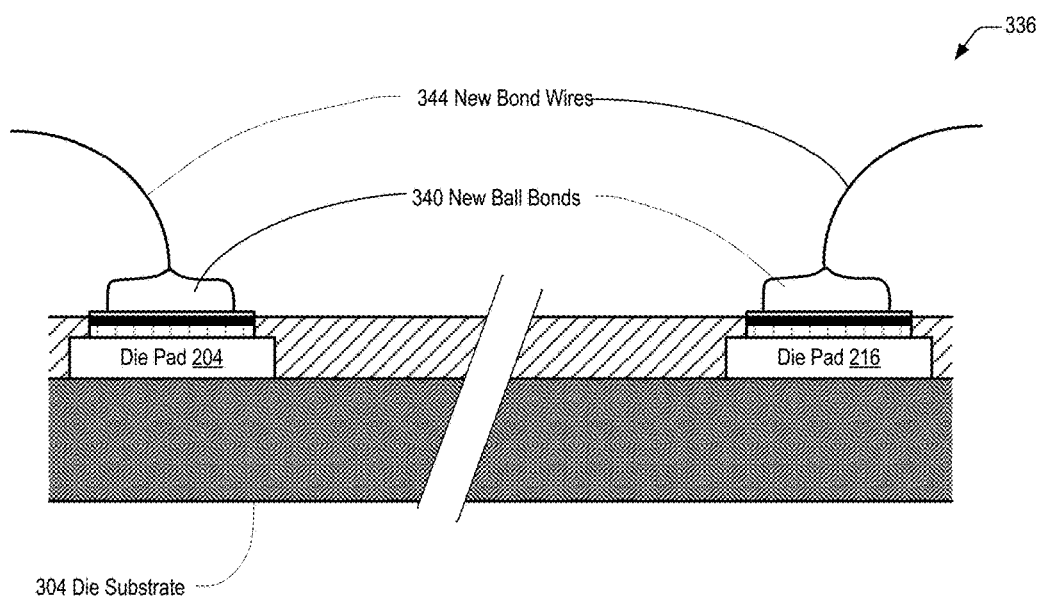

*Fig. 3G Reconditioned Die after 3D Printing Process Section A-A*
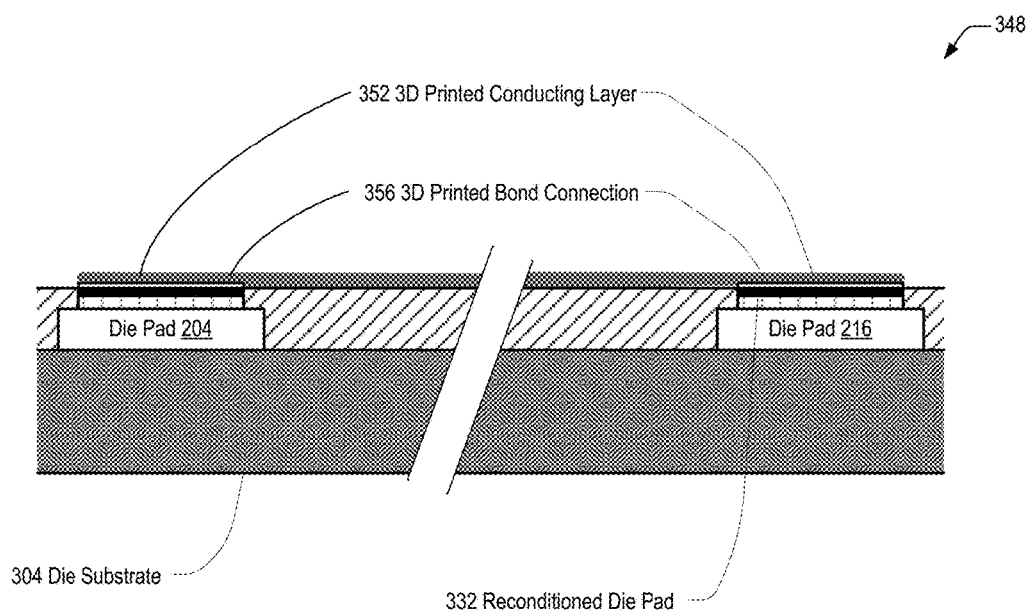
*Fig. 3H Reconditioned Die after 3D Printing Process Section A-A*
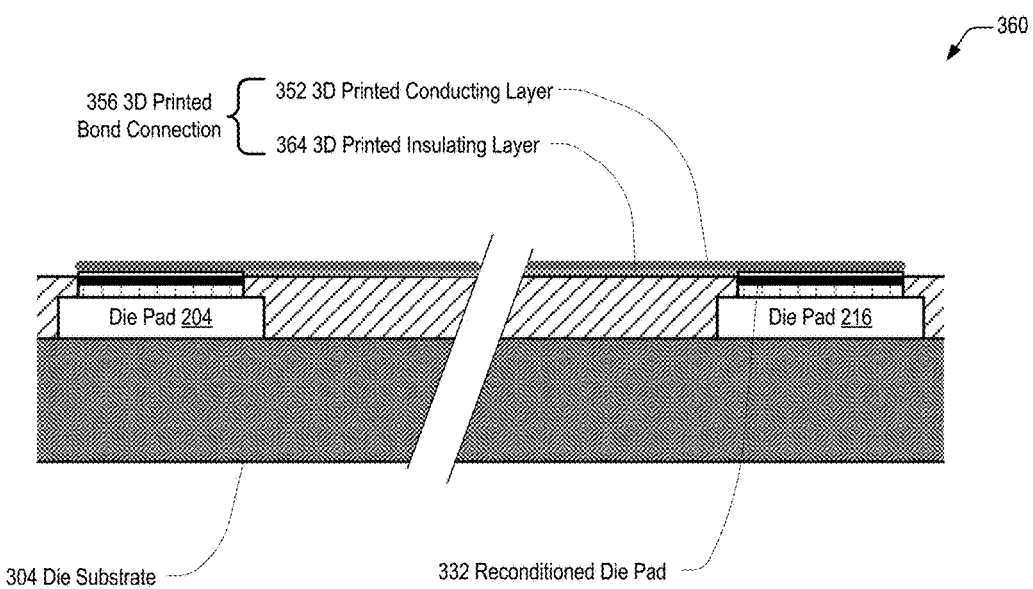

*Fig. 4A  Mounted Reconditioned Die*
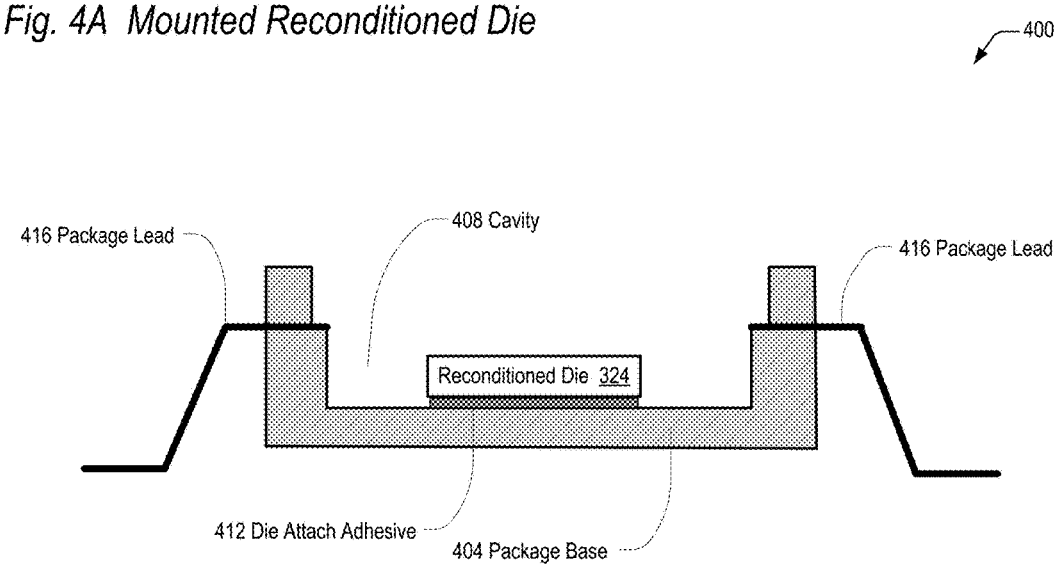
*Fig. 4B  Rebonded Reconditioned Die with New Bond Wires*
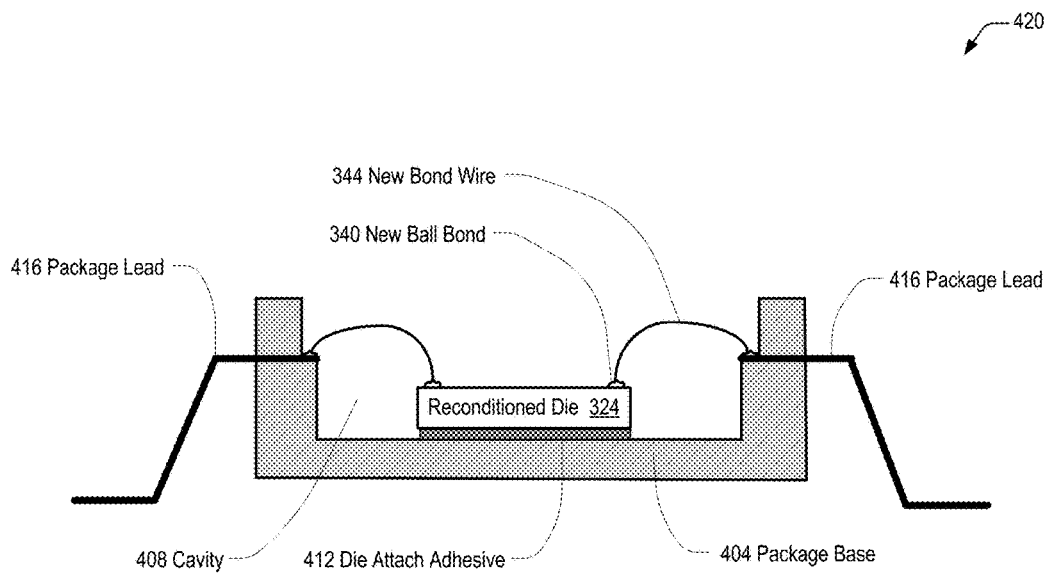

Fig. 4C  Rebonded and Encapsulated Reconditioned Die
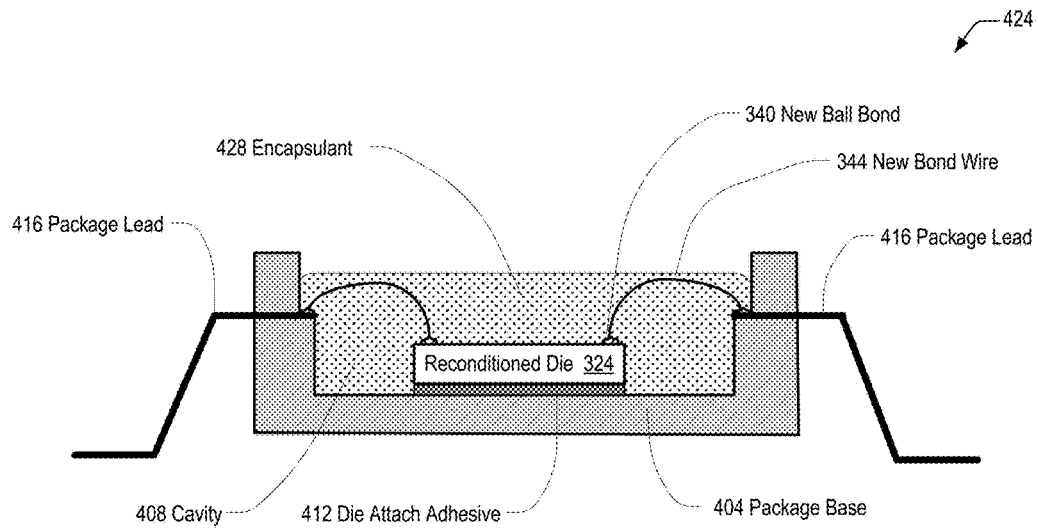
Fig. 4D  Repackaged Integrated Circuit
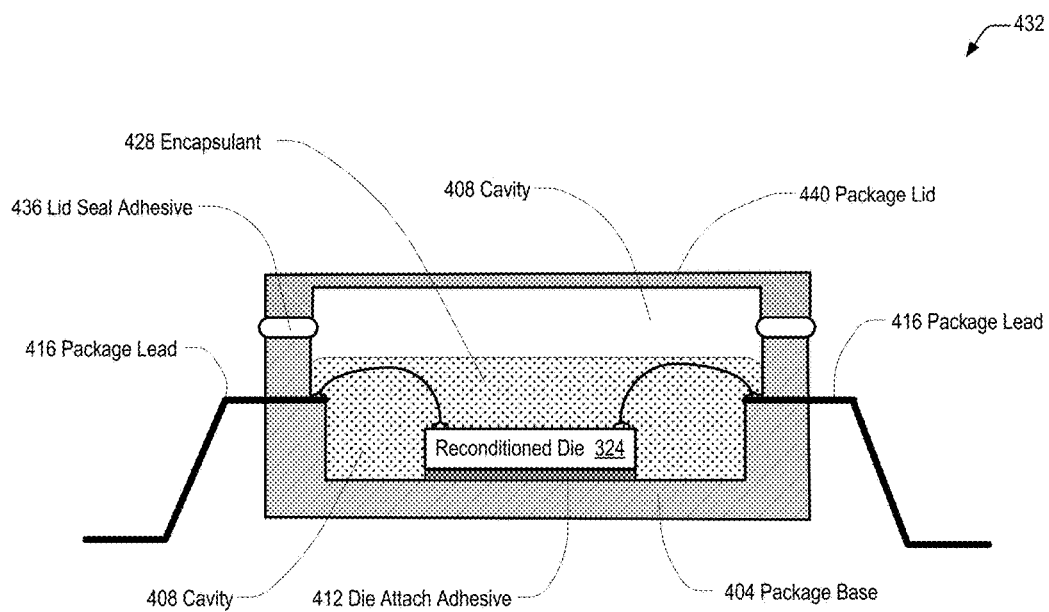

*Fig. 5A Rebonded Reconditioned Die with 3D Printed Bond Conductors*
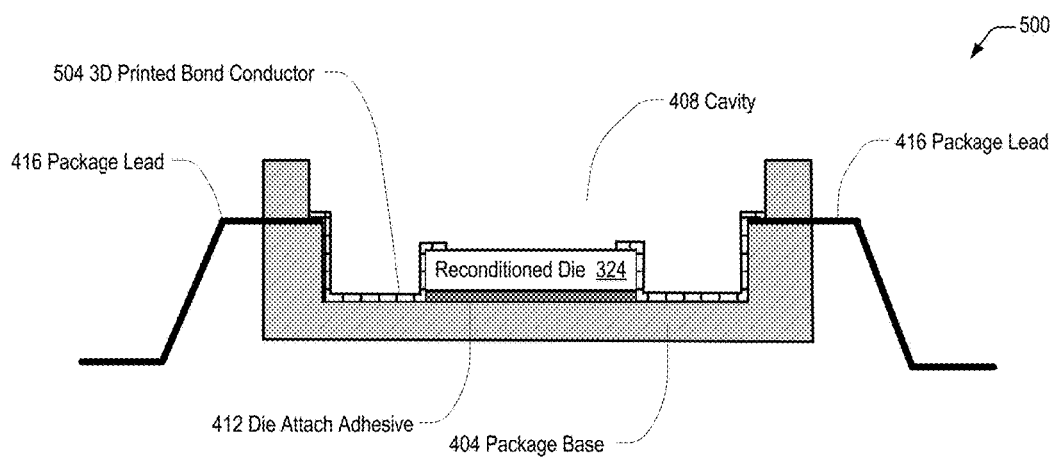
*Fig. 5B Rebonded and Encapsulated Reconditioned Die*
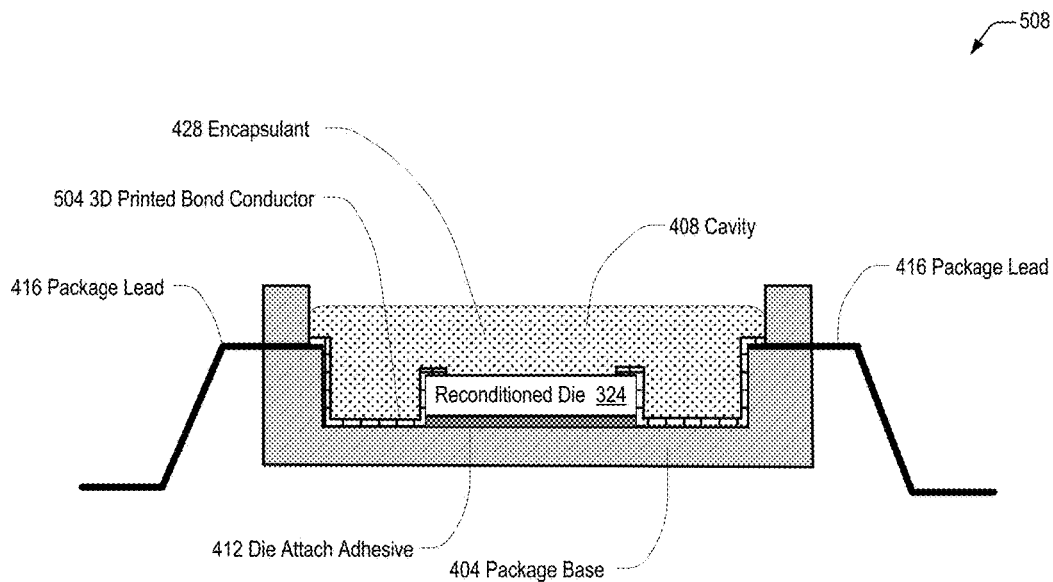

*Fig. 5C Repackaged Integrated Circuit*
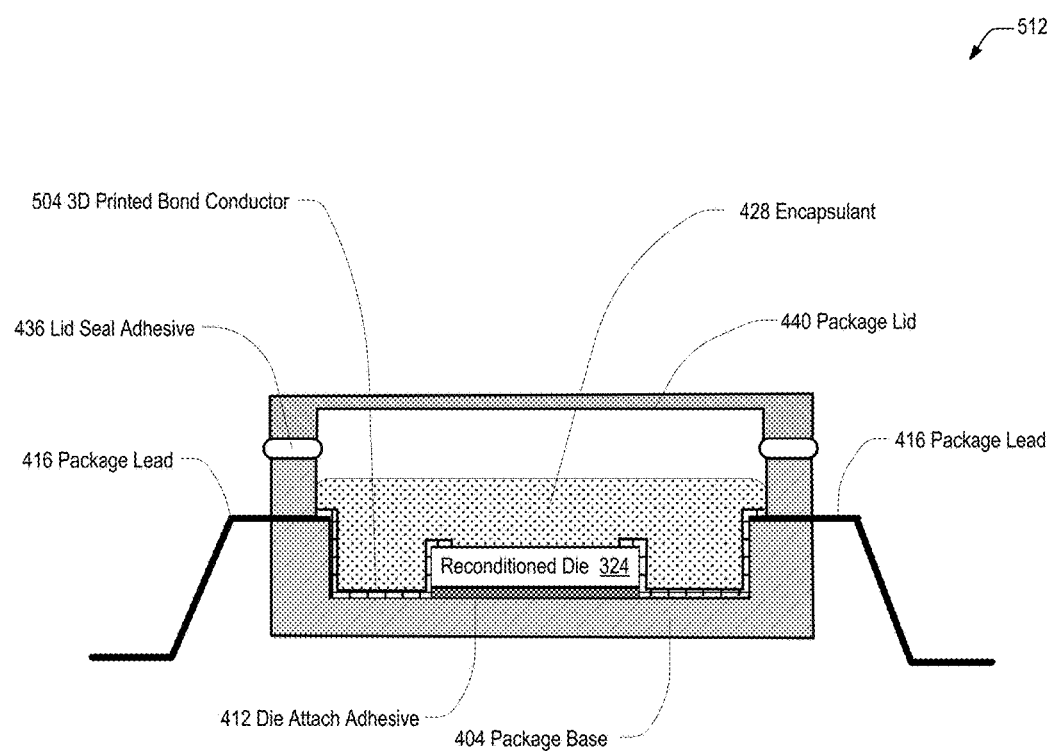

*Fig. 6A Rebonded Reconditioned Die with 3D Printed Bond Insulators*
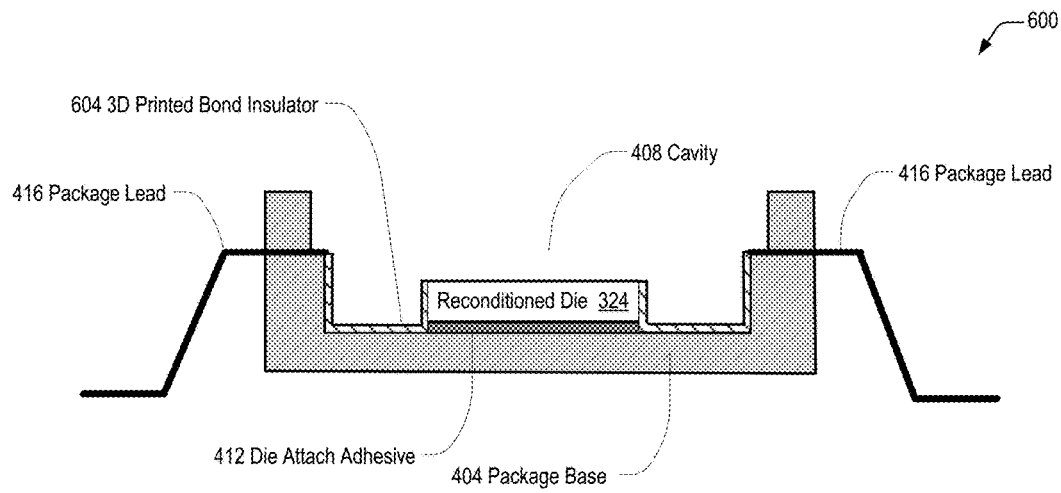
*Fig. 6B Rebonded Reconditioned Die with 3D Printed Bond Conductors over 3D Printed Bond Insulators*
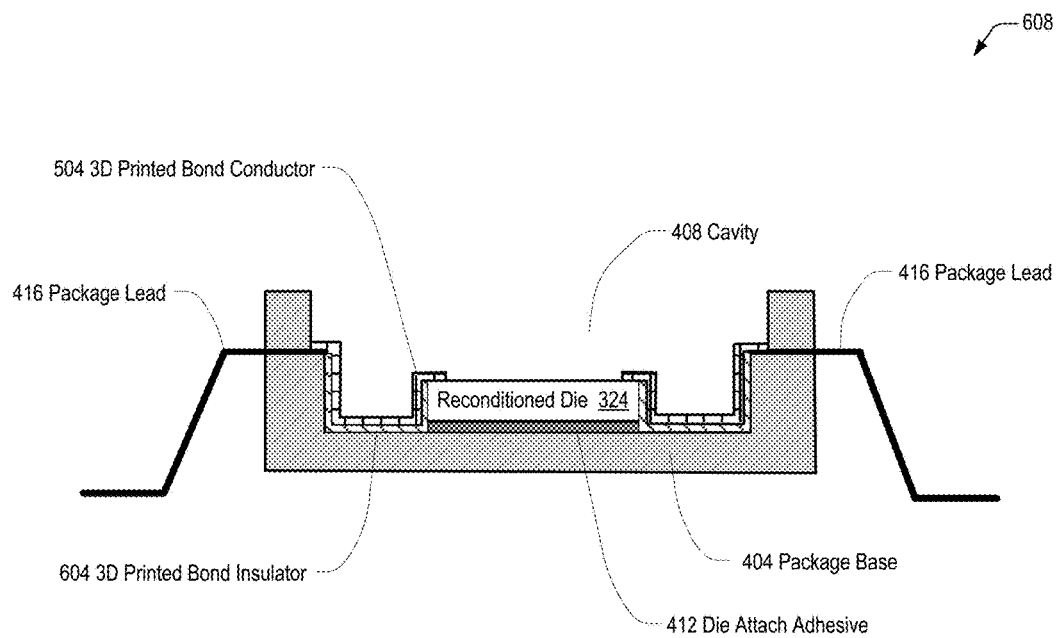

*Fig. 6C  Rebonded and Encapsulated Reconditioned Die*
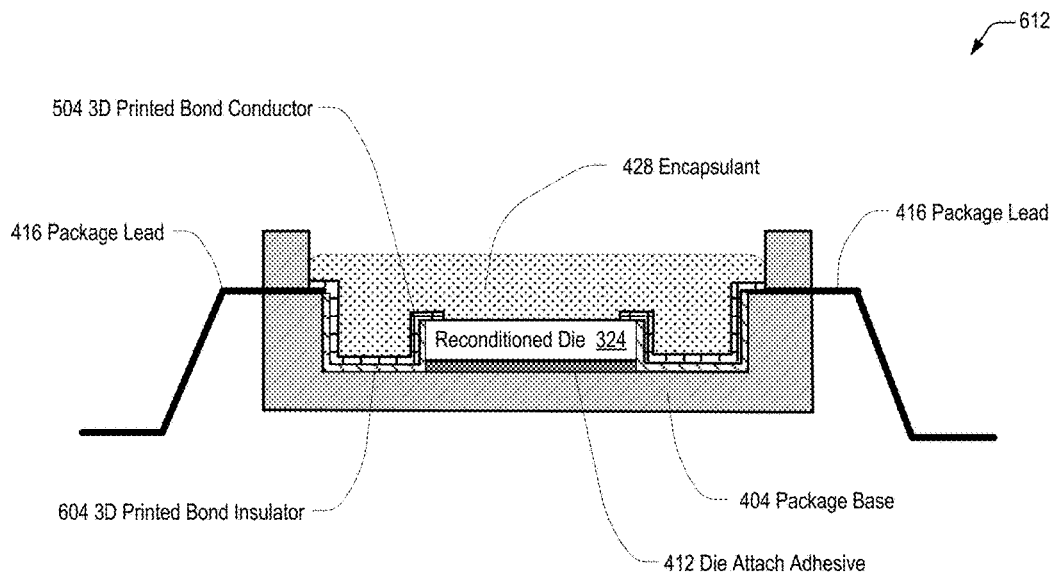
*Fig. 6D  Repackaged Integrated Circuit*
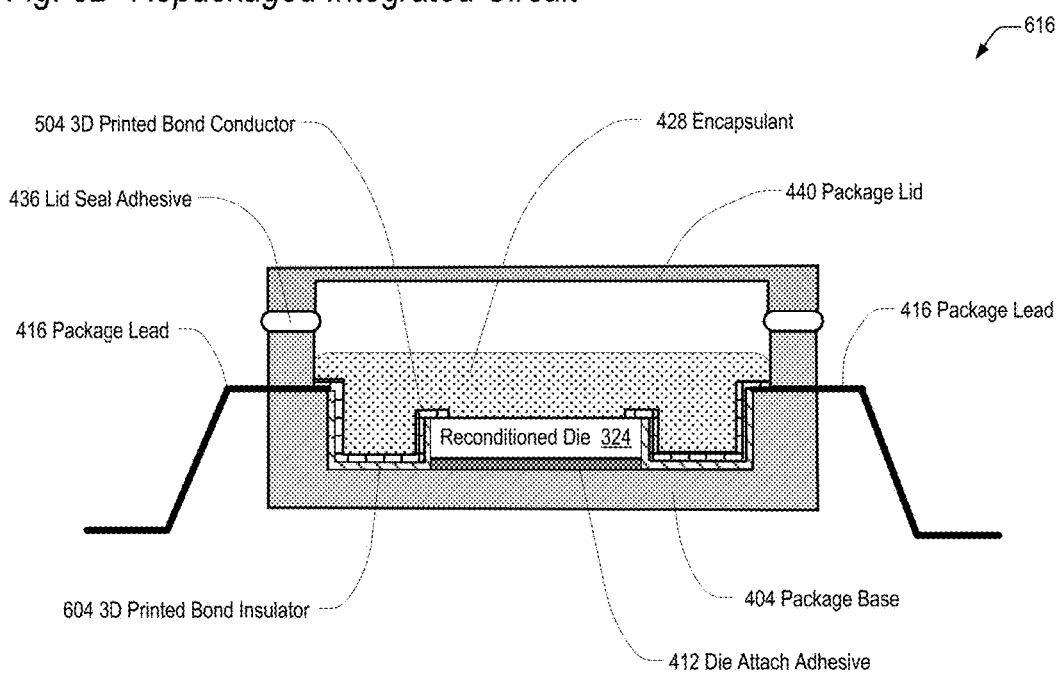

Fig. 7A Reconditioning Process for Extracted Die
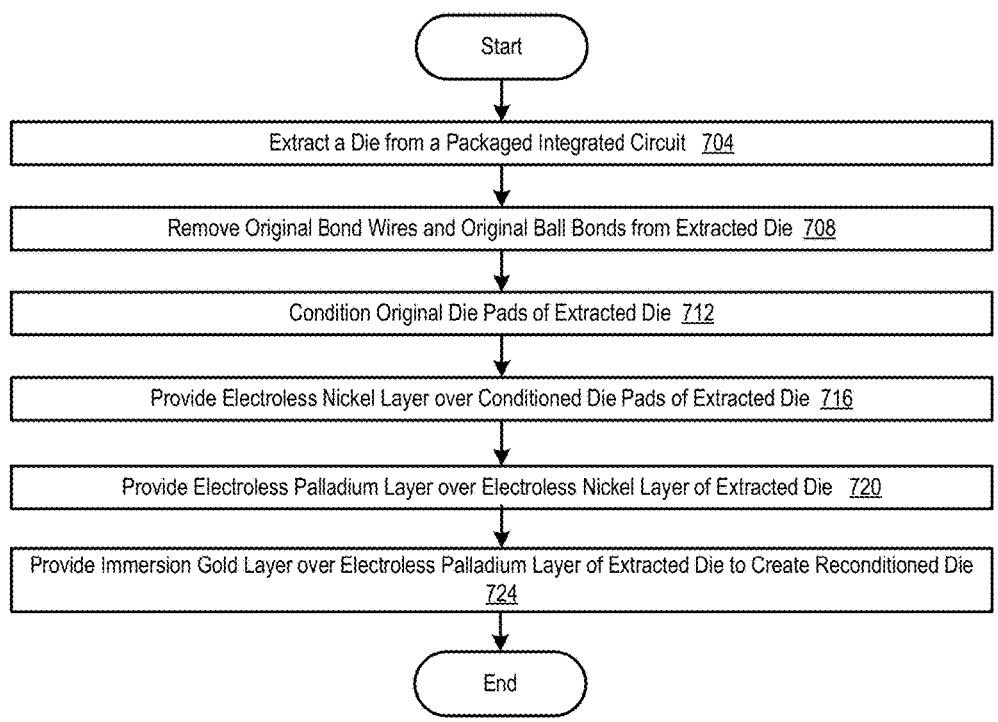

Fig. 7B Reconditioning Process for Extracted Die
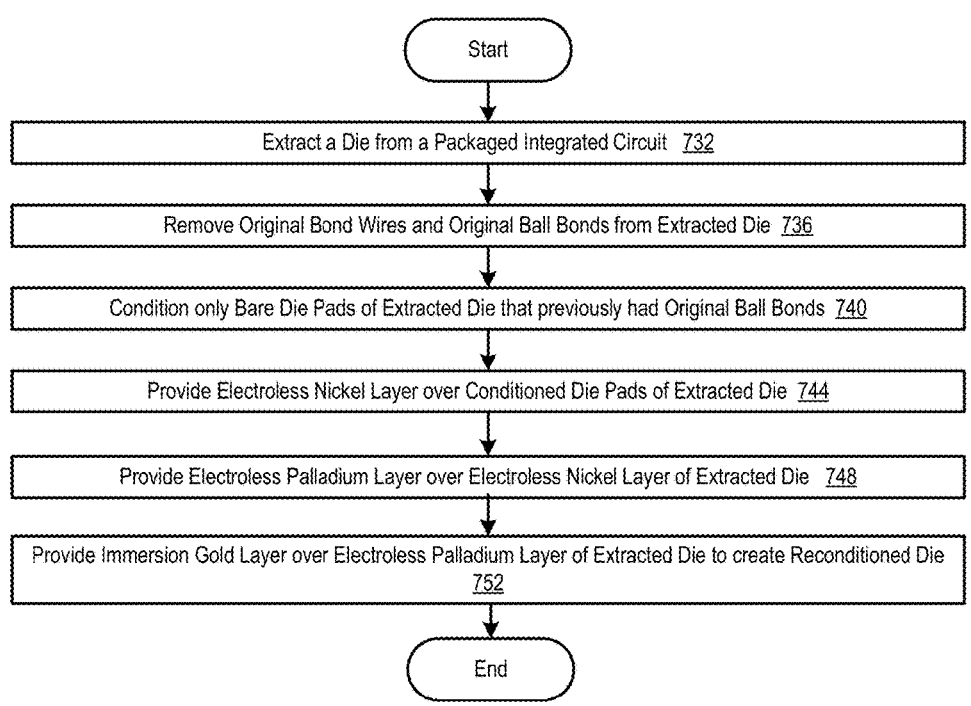

*Fig. 8 Apply Insulating and Conducting Material Spray with 3D Printer*
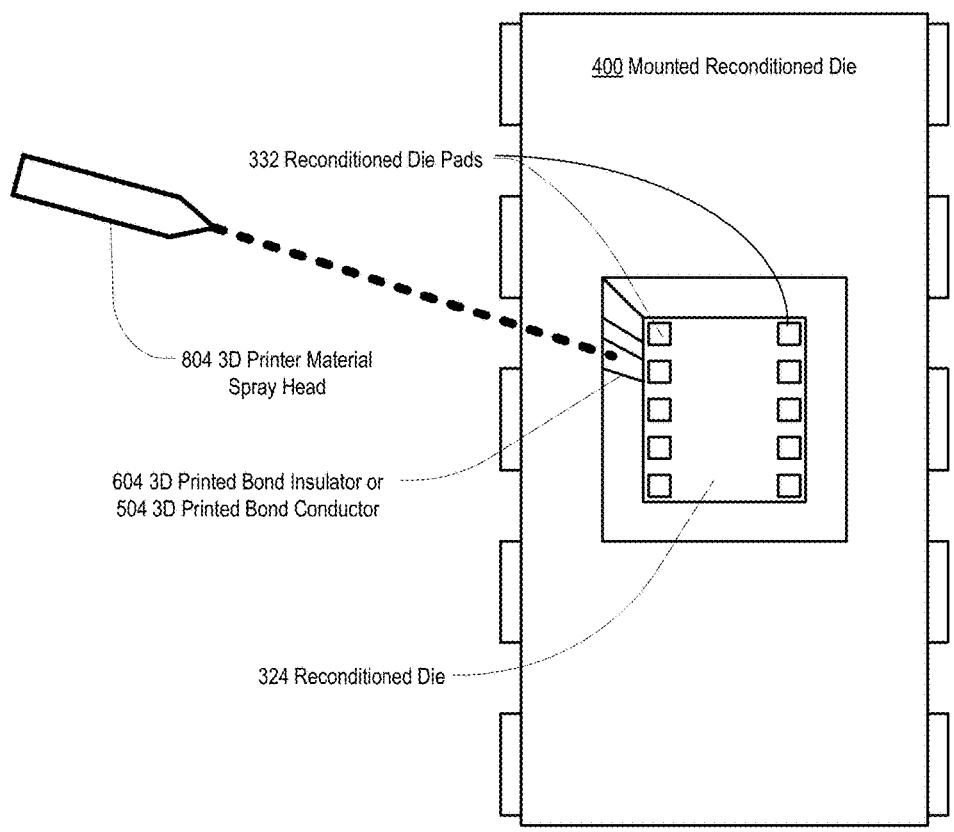

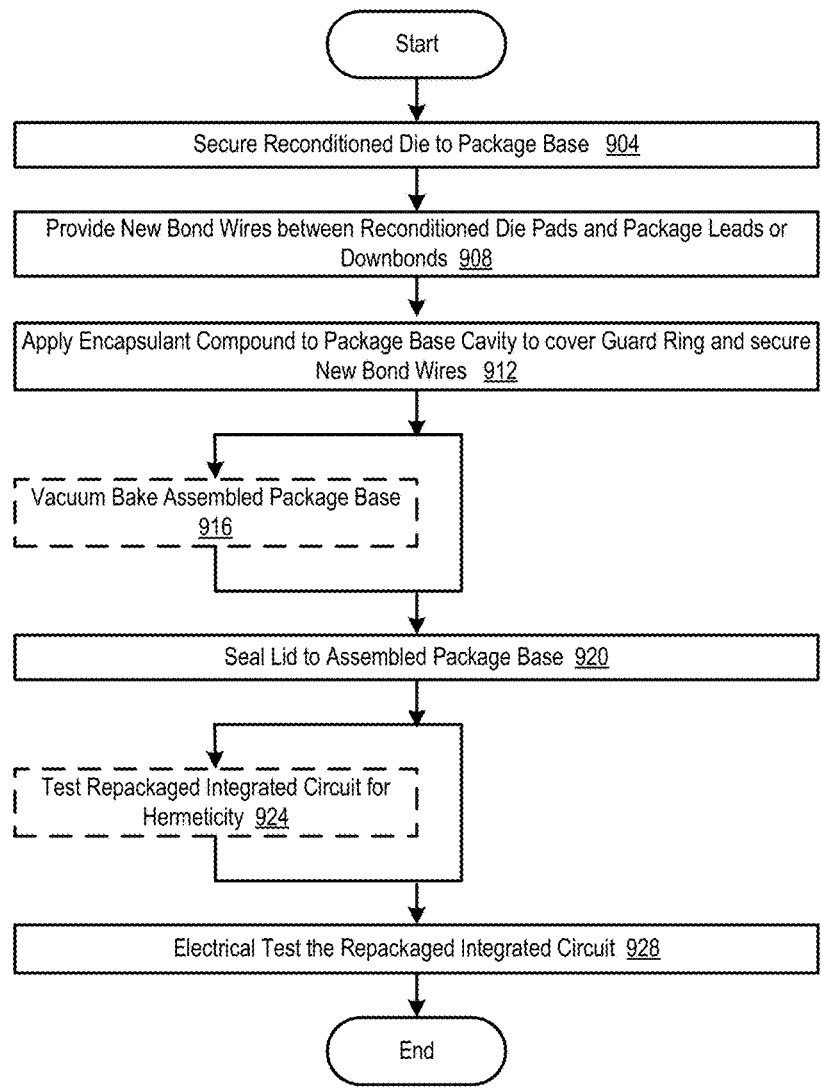
*Fig. 9A Assembly Process for Repackaged Reconditioned Die*

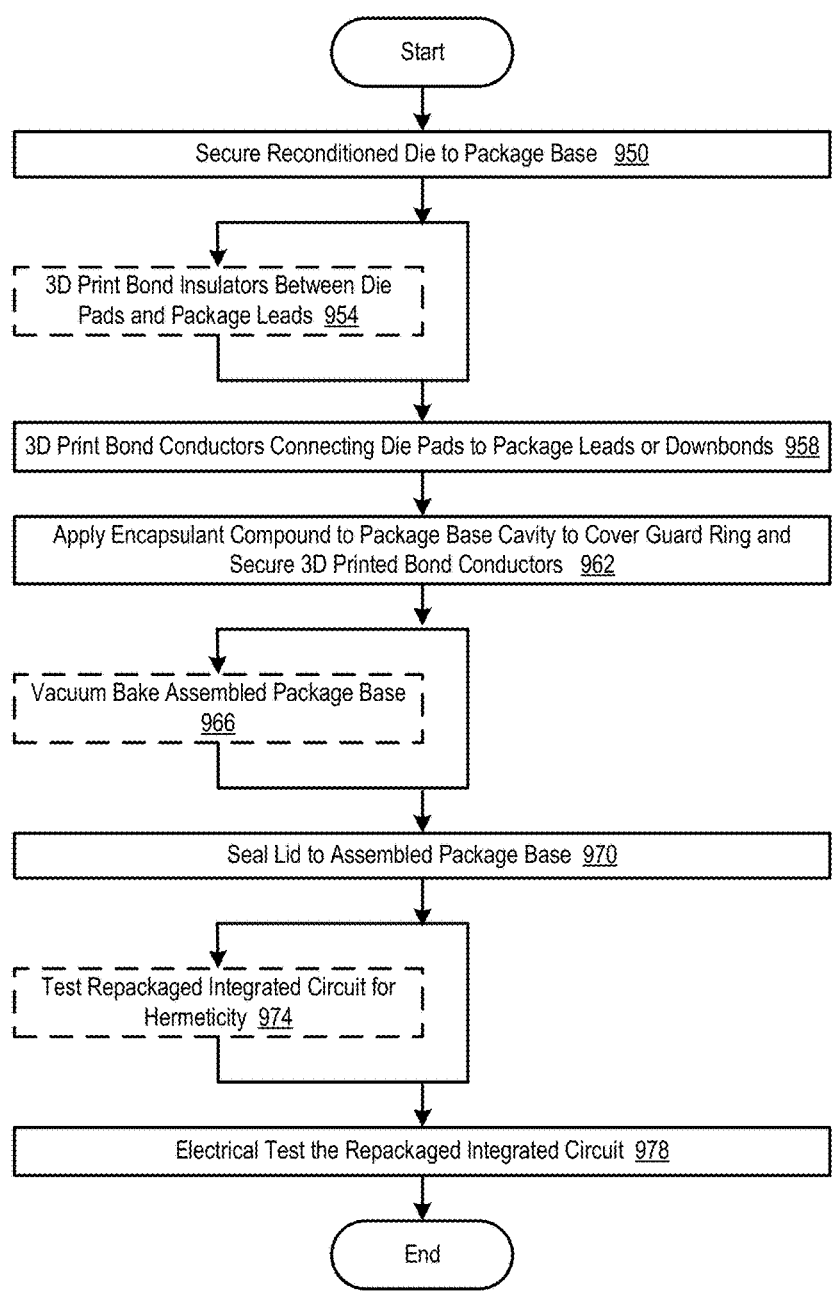
Fig. 9B Assembly Process for Repackaged Reconditioned Die

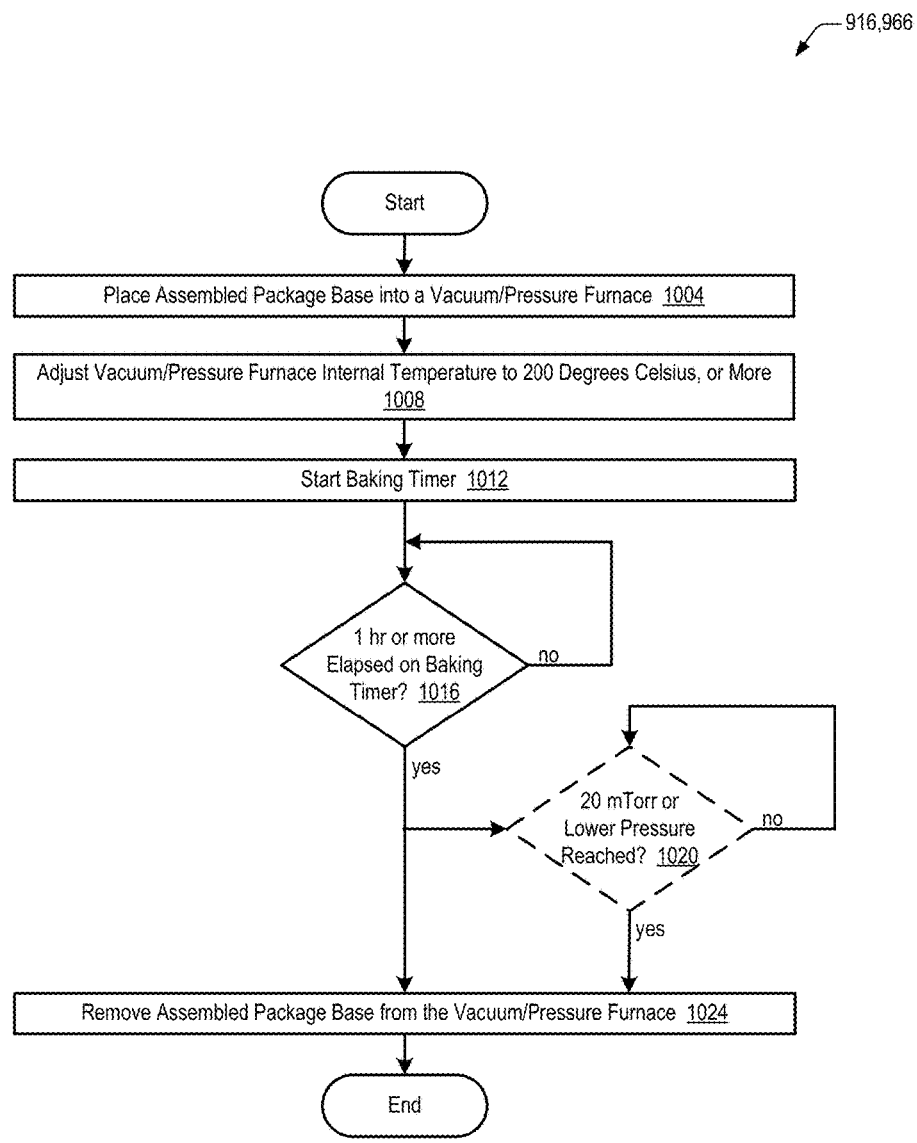
*Fig. 10 Vacuum Bake Process*

REPACKAGED RECONDITIONED DIE METHOD AND ASSEMBLY

FIELD

The present invention is directed to integrated circuit packaging. In particular, the present invention is directed to methods and apparatuses for creating repackaged integrated circuits capable of operating at extended temperatures over extended lifetimes.

BACKGROUND

Integrated circuits are available in many different packages, technologies, and sizes. Most integrated circuits are available in plastic packages, which are generally intended for commercial operating environments at a low cost. Commercial operating environments have a specified operating range from 0° C. to 70° C. Integrated circuits for military applications have historically been packaged in either metal or ceramic hermetic packages, which are able to work reliably in more demanding environments than commercial integrated circuits. Military operating environments have a specified operating range from −55° C. to 125° C. In order to save costs, the military has purchased integrated circuits through COTS (Commercial Off-The-Shelf) programs. However, these components are generally commercial grade components in plastic packages, and not intended for demanding environments requiring the broader temperature range reliability and durability of ceramic and metal hermetically packaged integrated circuits.

Depending on size and complexity, integrated circuits are available in a wide range of packages. Although many older integrated circuits were packaged using through-hole technology packages, surface mount packages have dominated over the past several decades. Surface mount packages generally have circuit density, cost, and other advantages over through-hole integrated circuits. Examples of through-hole packages include DIP (dual-in-line plastic) and PGA (pin grid array). Examples of surface mount packages include SOIC (small-outline integrated circuit) and PLCC (plastic leaded chip carrier).

In many cases, products requiring integrated circuits are in production or service for a longer time period than the manufacturing lifetime of a given integrated circuit. In such cases, it is not uncommon for parts to become obsolete or become unable to be purchased. For example, in a typical month, about 3% of all packaged integrated circuit product types become obsolete. One mitigating approach to this issue is to buy a sufficient lifetime inventory of spares for integrated circuits that are likely to become obsolete at a future date. However, this may be costly if a large quantity of integrated circuits needs to be purchased as spares. It also may result in far more spares being purchased that are actually required, since projected future needs may only be a rough estimate. When spares are needed in the future when an IC is no longer in active production, the ICs that are actually available may be in a different package than is required, since popular ICs are typically offered in multiple package options. For example, spares may be available in plastic DIP packages while the using assemblies require SOIC packages.

SUMMARY

The present invention is directed to solving disadvantages of the prior art. In accordance with embodiments of the present invention, a method is provided. The method includes one or more of removing one or more existing ball bonds from an extracted die, reconditioning die pads of the extracted die to create a reconditioned die, securing the reconditioned die within a cavity of a new package base, providing a plurality of bond connections interconnecting the reconditioned die pads and package leads or downbonds of the new package base, applying an encapsulating compound over the reconditioned die and the plurality of bond connections to create an assembled package base, and securing a lid to the new package base. Reconditioning includes applying a plurality of metallic layers to the die pads of the extracted die, the extracted die including a fully functional semiconductor die removed from a previous package. The encapsulating compound is configured to exhibit low thermal expansion.

In accordance with another embodiment of the present invention, a packaged integrated circuit is provided. The packaged integrated circuit includes a reconditioned die, a new package base including package leads and a cavity, a plurality of bond connections interconnecting reconditioned die pads and the package leads or downbonds of the new package base, an encapsulating compound applied over the reconditioned die and the plurality of bond connections to create an assembled package base, and a lid, secured to the assembled package base. The reconditioned die is secured within the cavity, and includes an extracted die with original ball bonds removed, and reconditioned die pads. The extracted die includes a fully functional semiconductor die including original ball bonds and removed from a previous package. Reconditioned die pads include a plurality of metallic layers applied to die pads of the extracted die. The encapsulating compound is configured to exhibit low thermal expansion.

An advantage of the present invention is that it provides an improved packaged integrated circuit that works reliably at extended temperatures, without requiring moisture getters or inert gases within a new integrated circuit package. The present invention utilizes reconditioned die pads to eliminate bonding interconnection reliability problems that may occur with dissimilar metals, and specifically with Gold-Aluminum interfaces. By eliminating processing steps with moisture getters and inert gases, a lower cost repackaged integrated circuit is achieved.

Another advantage of the present invention is it provides a hermetic integrated circuit with improved reliability using older extracted dice, which may no longer be available wither as wafers or as bare dice. By reclaiming extracted dice, removing original ball bonds and bond wires, and reconditioning die pads, a reconditioned die with improved reliability is available to be repackaged into new hermetic packages.

Another advantage of the present invention is it is able to accommodate both conventional wire bonding processes as well as newer 3D printed bond connection processes. Wire bonding is suitable for conventional interconnections to a conventional lead frame, where the die pinout generally matches the package pinout (i.e. not requiring crossed bond wires). 3D printed bond connections are suitable for both conventional and unconventional interconnections. Unconventional interconnections include situations where the die pinout does not match the package pinout, and crossed bond connections are required.

Yet another advantage of the present invention is it provides improved reliability compared to conventional integrated circuits by encapsulating bond interconnections between the reconditioned die and package leads or downbonds. Following wire bonding or 3D printing new bond connections, an encapsulant is added to the new package cavity to prevent metallic particles from flaking off and potentially contaminating the packaged integrated circuit and thereby reducing reliability.

Additional features and advantages of embodiments of the present invention will become more readily apparent from the following description, particularly when taken together with the accompanying drawings.

BRIEF DESCRIPTION OF THE DRAWINGS

FIG. 1 is a diagram illustrating a bare die with original die pads in accordance with embodiments of the present invention.

FIG. 2 is a diagram illustrating an extracted die with die pads, ball bonds, and bond wires in accordance with embodiments of the present invention.

FIG. 3A is a diagram illustrating a section A-A of an extracted die in accordance with embodiments of the present invention.

FIG. 3B is a diagram illustrating a section A-A of a modified extracted die after original ball bond and original bond wire removal in accordance with embodiments of the present invention.

FIG. 3C is a diagram illustrating a section A-A of electroless Nickel layer application in accordance with embodiments of the present invention.

FIG. 3D is a diagram illustrating a section A-A of electroless Palladium layer application in accordance with embodiments of the present invention.

FIG. 3E is a diagram illustrating a section A-A of immersion Gold layer application in accordance with embodiments of the present invention.

FIG. 3F is a diagram illustrating a section A-A of a reconditioned die after a new ball bonding process in accordance with embodiments of the present invention.

FIG. 3G is a diagram illustrating a section A-A of a reconditioned die after a 3D printing process in accordance with a first embodiment of the present invention.

FIG. 3H is a diagram illustrating a section A-A of a reconditioned die after a 3D printing process in accordance with a second embodiment of the present invention.

FIG. 4A is a diagram illustrating a mounted reconditioned die in accordance with embodiments of the present invention.

FIG. 4B is a diagram illustrating a rebonded reconditioned die with new bond wires in accordance with a first embodiment of the present invention.

FIG. 4C is a diagram illustrating a rebonded and encapsulated reconditioned die in accordance with the first embodiment of the present invention.

FIG. 4D is a diagram illustrating a repackaged integrated circuit in accordance with the first embodiment of the present invention.

FIG. 5A is a diagram illustrating a rebonded reconditioned die with 3D printed bond conductors in accordance with a second embodiment of the present invention.

FIG. 5B is a diagram illustrating a rebonded and encapsulated reconditioned die in accordance with the second embodiment of the present invention.

FIG. 5C is a diagram illustrating a repackaged integrated circuit in accordance with the second embodiment of the present invention.

FIG. 6A is a diagram illustrating a rebonded reconditioned die with 3D printed bond insulators in accordance with a third embodiment of the present invention.

FIG. 6B is a diagram illustrating a rebonded reconditioned die with 3D printed bond conductors over 3D printed bond insulators in accordance with the third embodiment of the present invention.

FIG. 6C is a diagram illustrating a rebonded and encapsulated reconditioned die in accordance with the third embodiment of the present invention.

FIG. 6D is a diagram illustrating a repackaged integrated circuit in accordance with the third embodiment of the present invention.

FIG. 7A is a flowchart illustrating a reconditioning process for an extracted die in accordance with an embodiment of the present invention.

FIG. 7B is a flowchart illustrating a reconditioning process for an extracted die in accordance with another embodiment of the present invention.

FIG. 8 is a diagram illustrating applying insulating and conducting material by a 3D printer in accordance with embodiments of the present invention.

FIG. 9A is a flowchart illustrating an assembly process for a repackaged integrated circuit in accordance with embodiments of the present invention.

FIG. 9B is a flowchart illustrating an assembly process for a repackaged integrated circuit in accordance with other embodiments of the present invention.

FIG. 10 is a flowchart illustrating a vacuum bake process in accordance with embodiments of the present invention.

DETAILED DESCRIPTION

Many operating environments require integrated circuit components capable of operating reliably at extended temperatures. Some of these environments include engine controls, down-hole drilling, and foundry manufacturing operations. Engine controls are often located in close proximity to an internal combustion, gas turbine, or jet engine, and are sometimes located on the engine side of a firewall. Down-hole drilling requires a wide variety of sensors, control components, and communication components operating in close proximity to a drill. In addition to heat generated by the drill itself, drilling far below the Earth's crust can reach operating environment temperatures of greater than 200° C. due to geothermal heat. Foundry operations require sensors and control components operating in close proximity to molten metal.

Although military grade integrated circuits are often desirable for extended high temperature environments, in many cases the environments themselves experience higher temperatures than the military grade integrated circuit temperature rating. For example, down-hole drilling environments sometimes reach temperatures of 250° C., while military-grade integrated circuits commonly have a −55° C. to 125° C. operating temperature range. Another problem is the required integrated circuits may not be available in packages that can reliably withstand these temperature extremes. Required integrated circuits are sometimes out of production, and it is typically prohibitively expensive to procure new integrated circuits in suitable packaging.

In some environments, traditional ceramic or metal hermetic packaging may be unsuitable for target environments. For example, a target environment may be sufficiently compact and space-constrained that traditional hermetic packaged integrated circuits may not fit within a required envelope. Or, the target environment may experience very high or unpredictable levels of shock and vibration that may render traditional integrated circuits using ball bonds and wire bonds potentially unreliable. Therefore, what is needed are methods and assemblies for creating repackaged integrated circuits able to work reliably within extended temperature operating environments.

Referring now to FIG. 1, a diagram illustrating a bare die 100 with original die pads 104 in accordance with embodiments of the present invention is shown. Bare die 100 is an individual semiconductor die or substrate, and is usually fabricated in suitable technologies including Silicon (Si) and Gallium Arsenide (GaAs). Bare die 100 may have a single die or multiple interconnected dice. Regardless whether bare die 100 includes a single die or multiple interconnected dice, die circuitry is connected to original die pads 104 of the bare die 100. Original die pads 104 are generally aluminum (Al) or copper (Cu) alloy pads. Section A-A provides a reference to an end-on view for other drawings to illustrate the construction and methods of the present invention. Bare die 100 is assumed to be a new production die, and not previously packaged.

Referring now to FIG. 2, a diagram illustrating an extracted die 200 with die pads, ball bonds, and bond wires in accordance with embodiments of the present invention is shown. An extracted die 200 is a fully functional semiconductor die removed from a previous integrated circuit package. In most embodiments, extracted die 200 is an individual semiconductor die or substrate, and is usually fabricated in suitable technologies including Silicon (Si) and Gallium Arsenide (GaAs). Extracted die 200 may have a single die or multiple interconnected dice. Regardless whether extracted die 200 includes a single die or multiple interconnected dice, die circuitry is connected to original die pads 204, 216 of the extracted die 200. Original die pads 204 and unbonded die pads 216 are generally aluminum (Al) or copper (Cu) alloy pads. Each previously used original die pad 204 of the extracted die 200 has an original ball bond 208 present (usually gold), and possibly an associated original bond wire 212. However, in many cases all original bond wires 212 have been removed from original ball bonds 208 as part of a die extraction process. When the extracted die 200 was present in whatever previous package was used for the extracted die 200, original bond wires 212 connected each of the original gold ball bonds 208 to a lead or a downbond of the previous package. FIG. 2 illustrates an exemplary extracted die 200, after it has been removed from a previous package. Therefore, some original bond wires 212 have been removed and only original gold ball bonds 208 and two original bond wires 212 remain. Depending on the specific extracted die 200, one or more unbonded die pads 216 may be present—where no original ball bond 208 and original bond wire 212 previously existed. Unbonded die pads 216 generally indicate a no connect to the previous package leads, and may or may not be connected to other circuitry of the extracted die 200. Section A-A provides a reference to an end-on view for other drawings to illustrate the construction and methods of the present invention.

Referring now to FIG. 3A, a diagram illustrating a section A-A of an extracted die 200 in accordance with embodiments of the present invention is shown. FIGS. 3A-3H illustrate a preferred reconditioning process to be applied to at least original die pads 204, and possibly unbonded die pads 216, for an extracted die 200 prior to assembling into a new hermetic assembly. In some embodiments, the processing steps shown in FIGS. 3C-3H may also be applied to original die pads 104 of a bare die 100, as well.

Extracted die 200 includes a die substrate 304 including various metallization layers known in the art. On the surface of the die substrate 304 are one or more die pads 204, 216. A passivation layer 308 is applied over the die substrate 304 in order to protect the circuits of the die substrate 304, and the passivation layer 308 is relieved at each of the original die pads 204, 216 in order to provide bonding access.

Where original ball bonds 208 and/or original bond wires 212 are present on original die pads, the die pads are die pads 204. Where no original ball bonds 208 and/or original bond wires 212 are applied to original die pads, the die pads are die pads 216. FIG. 3A illustrates the point at which the extracted die 200 has been removed from its' original package and one or more original ball bonds 208 and/or original bond wires 212 are present.

Referring now to FIG. 3B, a diagram illustrating a section A-A of a modified extracted die 312 after original ball bond and original bond wire removal in accordance with embodiments of the present invention is shown. A modified extracted die 312 is an extracted die 200 with all original ball bonds 208 and original bond wires 212 removed. Although in some embodiments original ball bonds 208 may be removed by mechanical means, in most cases it is preferable to use chemical removal means by known processes. FIG. 3B illustrates an original ball bond 208 and original bond wire 212 removed from the original die pad 204. Not shown in FIG. 3B is that after removing the original ball bond 208 and original bond wire 212, some amount of intermetallic residue may be present on the original die pads 204. This generally requires removal to make sure there are no impurities or residue on the original die pads 204. The residue removal is referred herein as conditioning the die pads 204. Removal is preferably performed using a mild acid wash. The acid wash is followed by an acid rinse that removes surface oxides present on the original die pads 204. For plating on an Aluminum die pad surface, a Zincate process is used to etch away a very fine layer of Aluminum from the die pads 204 and redeposit a layer of Zinc (Zn) on the die pads 204. The fine layer of Zinc will then act as a catalyst for the Nickel plating to follow, as described herein.

Once in a clean and flat state, the original die pads 204 are considered conditioned die pads and are ready to be reconditioned. Reconditioning of the present invention is a process whereby the original die pads 204, and possibly unbonded die pads 216, are built up by successive and ordered application of specific metallic layers prior to secondary wire bonding or 3D printing bond connection processes described herein.

In one embodiment, after an extracted die 200 is removed from a packaged integrated circuit, only original bond wires 212 are removed—thus leaving original ball bonds 208 on original die pads 204 of the extracted die 200. Original ball bonds 208 must be removed prior to reconditioning original die pads 204. Therefore, in some embodiments the metallic layers of the present invention are not provided to unbonded die pads 216, but rather original die pads 204 following original ball bond 208 removal.

Referring now to FIG. 3C, a diagram illustrating a section A-A of electroless Nickel layer application in accordance with embodiments of the present invention is shown. Electroless plating is more cost effective than electroplating since it does not require expensive photolithography and etch processes. However, electroless processes generally require thicker metal layers for good bondability. The present application includes both electroless plating and electroplating.

A Nickel (Ni) layer 316 applied over a conditioned conventional Aluminum (Al) bond pad 204, 216 have been found to protect pad surfaces. Nickel possesses a much higher elastic modulus than either Copper (Cu) or Aluminum (Al), which leads Nickel to have high stiffness and fracture toughness and resist deflection and absorb energy during bonding processes. Thus, Nickel is a preferred metallic layer 316 for the initial layer application following original die pad 204, 216 conditioning.

An electroless Nickel plating bath is very complex and contains more chemicals (i.e. reducing agents, complexant or chelating agents, stabilizers, etc) than the Nickel source alone. These bath components perform specific functions during the chemical reaction. They are important in order to obtain a good quality Nickel deposit and must be monitored carefully during processing.

The plating rate of Nickel is a controllable parameter during the plating process, which in turn affects the final surface roughness. A fast plating rate will obviously increase the process throughput, but fast plating rates can also result in a rougher Nickel finish. Therefore, a careful balance must be maintained between processing speed and surface quality. If the Nickel surface is too rough, the next successive metal layers to be plated over the Nickel (i.e. Palladium and Gold) will follow the contours and also result in a rougher surface. Both surface hardness and roughness have a strong effect on wire bondability and bond strength. Harder and rougher surfaces are typically less bondable. For wire bonding applications, the electroless Nickel layer 316 is generally 120-240 microinches thick. However, since the processes of the present application alternatively apply 3D printed bond connections 356 to the reconditioned die pads 332, a rougher Nickel layer 316 may be preferable for those embodiments to aid in adhesion since conventional wire bonds are not utilized. Thus, a faster Nickel plating 316 process may not only be preferable for application of subsequent layers including 3D printed bond connections 356, it also increases production throughput for reconditioned die pads 332.

Referring now to FIG. 3D, a diagram illustrating a section A-A of electroless Palladium layer 320 application in accordance with embodiments of the present invention is shown. Electroless Palladium (Pd) 320 is applied over the electroless Nickel (Ni) 316 layer of FIG. 3C in order to inhibit Nickel diffusion into the immersion gold layer 328 applied afterward.

Palladium plating 320 was first investigated as a replacement for purely gold plating in order to alleviate the high cost of gold plating. Palladium and Palladium-Nickel alloys were initially developed for contact wear resistance in electrical connector applications, but other technical advantages were identified as usage grew. Not only is a pure Palladium layer 320 very hard, but it is also very dense, which assists as a diffusion barrier. As with the electroless Nickel layer 316, the electroless Palladium layer 320 requires a catalyst pretreatment to prepare the surface for deposition. The metal source is typically a Palladium-Ammonia compound with a hydrazine reducing agent for metal deposition. For wire bonding applications, the electroless Palladium layer 320 is generally 2-4 microinches thick, approximately 2 orders of magnitude thinner than the electroless Nickel layer 316. Similar thicknesses may be used for 3D printed bond connections 356.

Referring now to FIG. 3E, a diagram illustrating a section A-A of immersion Gold layer 328 application in accordance with embodiments of the present invention is shown. The immersion Gold layer 328 is applied over the electroless Palladium layer 320, and provides the top layer of the reconditioned die pads 332. Gold has long been a mature plating process for semiconductor applications. Two types of Gold plating processes through chemical reactions are used today: immersion and autocatalytic. Immersion Gold plating 328 is a self-limiting galvanic displacement process, where no reducing agent is required. For wire bonding applications, the electroless Gold layer 328 is generally at least 1-2 microinches thick, and preferably thicker. Similar thicknesses of 1-2 microinches thick may be used for 3D printed bond connections 356. Following the process step of FIG. 3E, the die is a reconditioned die 324. A bare die 100 may also be processed as shown in FIGS. 3C-3F, but does not require the processing steps shown in FIGS. 3A and 3B due to the absence of ball bonds 208, oxides, and other residues or metallic impurities present on original die pads 104.

Because the plating process described herein uses gold as the bonding layer with gold bond wire 344 or 3D printed bond connections 356, there is no Aluminum (Al)-Gold (Au) interface that can degrade and corrode. Thus, the plating process produces more reliable bonding interfaces and is preferred for high temperature and hermetic applications over previous processes that maintained Al—Au interfaces and utilize moisture getter, noble gas insertion, and vacuum bakes to purge moisture from integrated circuit packages.

Referring now to FIG. 3F, a diagram illustrating a section A-A of a reconditioned die after a new ball bonding process 336 in accordance with embodiments of the present invention is shown. The combination of the electroless Nickel layer 316, electroless Palladium layer 320, and the immersion Gold layer 328 produces reconditioned die pads 332. Once die pads 204, 216 have been reconditioned, the reconditioned die 324 is secured within a new package. A suitable die attach adhesive 412 or similar compound secures the reconditioned die 324 within a cavity 408 of a new package base 404. Once secured, new ball bonds 340 and new bond wires 344 are provided between the reconditioned die pads 332 and either package leads 416 or downbonds, as required. New ball bonds 340 and new bond wires 344 may be provided to both original die pads 204 (i.e. where an original ball bond 208 previously existed) or to previously unbonded die pads 216, depending on the desired functionality. The processing shown in FIG. 3F is before encapsulant 428 is introduced, or performing lid seal operations.

Referring now to FIG. 3G, a diagram illustrating a section A-A of a reconditioned die after a 3D printing process 348 in accordance with a first embodiment of the present invention is shown. In some embodiments, rather than applying conventional ball bonds 340 and bond wires 344 as shown in FIG. 3F, it may be preferable to 3D print a bond connection 356 instead. In the illustrated embodiment, the 3D printed bond connection 356 is a 3D printed conducting layer 352. Once die pads 204, 216 have been reconditioned, a 3D printer applies 3D printed bond connections 356 as described herein. 3D Printed conducting layer 352 thickness can be less than 2 microns and is preferably 0.5-1 microns The embodiment shown in FIG. 3G is suitable where there are only non-conductive surfaces between reconditioned die pads 332 and package leads 416 or downbonds. For example, if a new package base 404, die attach adhesive 412, and non-die pad 332 surfaces of the reconditioned die 324 are non-conductive, then 3D printed conducting layers 352 are appropriate by themselves. The processing shown in FIG. 3G is before encapsulant 428 is applied, or a lid is sealed to a package base.

Referring now to FIG. 3H, a diagram illustrating a section A-A of a reconditioned die after a 3D printing process 360 in accordance with a second embodiment of the present invention is shown. In other embodiments, rather than applying conventional ball bonds 340 and bond wires 344 as shown in FIG. 3F or only 3D printed conducting layer 352 as shown in FIG. 3G, it may be preferable to include a 3D printed insulating layer 364. In the illustrated embodiment, the 3D printed bond connection 356 includes both a 3D printed conducting layer 352 and a 3D printed insulating layer 364. 3D Printed conducting layer 352 and 3D printed insulating layer 364 thickness each can be less than 2 microns and is preferably 0.5-1 microns. Therefore, the preferred thickness of 3D printed bond connections 356 is less than 4 microns total.

Once die pads 204, 216 have been reconditioned, a 3D printer applies 3D printed bond connections 356 as described herein. The embodiment shown in FIG. 3H is suitable where there are conductive surfaces between reconditioned die pads 332 and package leads 416 or downbonds. For example, if a new package base 404 is conductive, then 3D printed insulating layer 364 is first applied over conductive surfaces of the new package base 404 between the reconditioned die pads 332 and package leads 416. Once the 3D printed insulating layer 364 has been applied, a 3D printer applies a 3D printed conducting layer 352 over the 3D printed insulating layer 364. The 3D printed conducting layer 352 makes electrical contact between a reconditioned die pad 332 and a package lead 416 or downbond, while the 3D printed insulating layer 364 electrically isolates the 3D printed conducting layer 352 from conductive surfaces of the new package base 404. The processing shown in FIG. 3H is before encapsulant 428 is introduced, or performing lid seal operations.

Referring now to FIG. 4A, a diagram illustrating a mounted reconditioned die 400 in accordance with embodiments of the present invention is shown. FIG. 4A illustrates the step immediately following fabrication of the reconditioned die 324 shown in FIG. 3E. The reconditioned die 324 is secured within a cavity 408 of a package base 404 with a die attach adhesive 412. The package base 404 includes any number of package leads 416, which provide electrical contact with other substrates or printed circuit boards. In the preferred embodiment, the package base 404 may be a hermetic package base 404, such as a metal or ceramic package base 404. In other embodiment, the package base 404 may be non-hermetic package base 404. In some embodiments, the die attach adhesive 412 may be a low-halide content die attach adhesive, while in other embodiments the die attach adhesive 412 may be a conventional die attach adhesive 412. Once in the configuration shown in FIG. 4A, the mounted reconditioned die 400 is ready to be bonded.

Referring now to FIG. 4B, a diagram illustrating a rebonded reconditioned die with new bond wires 420 in accordance with a first embodiment of the present invention is shown. The embodiment illustrated in FIG. 4B shows new bond wires 344 and new ball bonds 340 applied to the reconditioned die 324 and package leads 416. Although not specifically illustrated, it should be understood that reconditioned die 324 includes reconditioned die pads 332, to which new bond wires 344 and new ball bonds 340 are attached. The new bond wires 344 may be applied by any known means, including but not limited to thermosonic bonding or wedge bonding. FIG. 4B provides an alternative view to FIG. 3F.

Referring now to FIG. 4C, a diagram illustrating a rebonded and encapsulated reconditioned die 424 in accordance with the first embodiment of the present invention is shown. After all required new bond wires 344 and new ball bonds 340 have been provided between reconditioned die pads 332 and package leads 416 or downbonds, an encapsulant compound 428 is applied within the cavity 408. The encapsulant compound 428 at least partially fills the cavity 408, and in some embodiment fully fills the cavity 408. In the preferred embodiment, the encapsulant 428 completely covers all new bond wires 344. In other embodiments, the encapsulant 428 covers at least conductive areas on the top side of the reconditioned die 324, including any guard rings that may be present. In high shock and vibration environments, there may be a possibility of metallic residue flaking off and potentially contaminating the repackaged integrated circuit 432. The encapsulant 428 prevents any such flaking material from contaminating the interior of the repackaged integrated circuit 432. The rebonded and encapsulated reconditioned die 424 is considered to be an assembled package base 424.

Referring now to FIG. 4D, a diagram illustrating a repackaged integrated circuit 432 in accordance with the first embodiment of the present invention is shown. Following application of the encapsulant 428 to the cavity 408, the assembly at that point is an assembled package base 424. In some embodiments, the assembled package base 424 is vacuum baked according to the process shown in FIG. 10. In other embodiments, the assembled package base 424 is baked according to the process shown in FIG. 10, but no vacuum is applied during the baking process. In yet other embodiments, the assembled package base 424 is not baked or vacuum baked.

Following any bake or vacuum bake process, a package lid 440 is sealed to the package base 404 using a lid seal adhesive 436. In the preferred embodiment, the package base 404 is a hermetic package base 404, the package lid 440 is a hermetic package lid 440, the lid seal 436 is a hermetic solder or other form of hermetic attachment able to prevent contamination of the cavity 408 by outside agents including moisture, and the die attach adhesive 412 may be a low-halide die attach adhesive 412. A low halide die attach adhesive 412 has less than 10 parts per million (ppm) halide. It has been well established that halogens in a bond interface may degrade bond strength since out-gassed products from adhesives containing halogens rapidly corrode Aluminum metallization in integrated circuits at high temperatures, thus reducing product lifetime. Hermetic packages are generally manufactured from metal, glass, or ceramic materials. In other embodiments, any of the package base 404, the package lid 440, or the lid seal adhesive 436 may be non-hermetic. Following lid seal operations, the integrated circuit is a repackaged integrated circuit 432 and ready for any hermeticity, electrical, or functional tests required.

Referring now to FIG. 5A, a diagram illustrating a rebonded reconditioned die with 3D printed bond conductors 500 in accordance with a second embodiment of the present invention n is shown. This process substitutes 3D printed bond conductors 504 for new bond wires 344 and new ball bonds 340 of FIGS. 4B-4D.

The process of FIGS. 5A-5C assumes the processing step illustrated in FIG. 4A has been performed. That is, the reconditioned die 324 is secured within a cavity 408 of a package base 404 with a die attach adhesive 412. The process of 5A-5C is preferably used when low-profile and reliable 3D printed bond connections 356 are desired, and there are not conductive surfaces under the 3D printed bond connections 356 (such as a metal cavity 408 within a metal package base 404, for example). The process of FIGS. 5A-5C applies 3D printed bond conductors 504, built from 3D printed conducting layers 352 of FIG. 3G, directly to surfaces of the reconditioned die 324, die attach adhesive 412, and package base 404. 3D printed bond conductors 504 can be less than 2 microns and are preferably 0.5-1 microns, and provide electrical connections between reconditioned die pads 332 and package leads 416 or downbonds. In the preferred embodiment, 3D printed bond conductors 504 completely cover one or more reconditioned die pads 332 on the reconditioned die 324. Details of the 3D printing process applied to 3D printed bond conductors 504 is shown and described in more detail with reference to FIG. 8. Although not specifically illustrated, it should be understood that reconditioned die 324 includes reconditioned die pads 332, to which 3D printed bond conductors 504 are attached.

Referring now to FIG. 5B, a diagram illustrating a rebonded and encapsulated reconditioned die 508 in accordance with the second embodiment of the present invention is shown. After all required 3D printed bond conductors 504 have been provided between reconditioned die pads 332 and package leads 416 or downbonds, an encapsulant compound 428 is applied within the cavity 408. The encapsulant compound 428 at least partially fills the cavity 408, and in some embodiment fully fills the cavity 408. In the preferred embodiment, the encapsulant 428 completely covers all 3D printed bond conductors 504. In other embodiments, the encapsulant 428 covers at least conductive areas on the top side of the reconditioned die 324, including any guard rings that may be present. In high shock and vibration environments, there may be a possibility of metallic residue flaking off and potentially contaminating the repackaged integrated circuit 512. The encapsulant 428 prevents any such flaking material from contaminating the interior of the repackaged integrated circuit 512.

Referring now to FIG. 5C, a diagram illustrating a repackaged integrated circuit 512 in accordance with the second embodiment of the present invention is shown. Following application of the encapsulant 428 to the cavity 408, the assembly at that point is considered an assembled package base 508. In some embodiments, the assembled package base 508 is vacuum baked according to the process shown in FIG. 10. In other embodiments, the assembled package base 508 is baked according to the process shown in FIG. 10, but no vacuum is applied during the baking process. In yet other embodiments, the assembled package base 508 is not baked or vacuum baked.

Following any bake or vacuum bake process, a package lid 440 is sealed to the package base 404 using a lid seal adhesive 436. In the preferred embodiment, the package base 404 is a hermetic package base 404, the package lid 440 is a hermetic package lid 440, the lid seal 436 is a hermetic solder, sealing glass, or other form of hermetic attachment able to prevent contamination of the cavity 408 by outside agents including moisture, and the die attach adhesive 412 may be a low-halide die attach adhesive 412. A low halide die attach adhesive 412 has less than 10 parts per million (ppm) halide. It has been well established that halogens in a bond interface may degrade bond strength since out-gassed products from adhesives containing halogens rapidly corrode Aluminum metallization in integrated circuits at high temperatures, thus reducing product lifetime. Hermetic packages are generally manufactured from metal, glass, or ceramic materials. In other embodiments, any of the package base 404, the package lid 440, or the lid seal adhesive 436 may be non-hermetic. Following lid seal operations, the integrated circuit is a repackaged integrated circuit 512 and ready for any hermeticity, electrical, or functional tests required.

Referring now to FIG. 6A, a diagram illustrating a rebonded reconditioned die with 3D printed bond insulators 600 in accordance with a third embodiment of the present invention is shown. This process substitutes 3D printed bond insulators 604 and 3D printed bond conductors 504 for new bond wires 344 and new ball bonds 340 of FIGS. 4B-4D, and adds 3D printed bond insulators 604 to the process shown in FIGS. 5A-5C.

The process of FIGS. 6A-6D assumes the processing step illustrated in FIG. 4A has been performed. That is, the reconditioned die 324 is secured within a cavity 408 of a package base 404 with a die attach adhesive 412. The process of 6A-6D is preferably used when low-profile and reliable 3D printed bond connections 356 are desired, and there are at least some conductive surfaces under the 3D printed bond connections 356 (such as a metal cavity 408 within a metal package base 404, for example). The process of FIGS. 6A-6D applies 3D printed bond insulators 604 and 3D printed bond conductors 504, built from 3D printed insulating layers 364 and 3D printed conducting layers 352, respectively, of FIG. 3H, directly to surfaces of the reconditioned die 324, die attach adhesive 412, and package base 404. 3D printed bond conductors 504 provide electrical connections between reconditioned die pads 332 and package leads 416 or downbonds. Details of the 3D printing process to apply 3D printed bond insulators 604 and 3D printed bond conductors 504 are shown and described in more detail with reference to FIG. 8. Although not specifically illustrated, it should be understood that reconditioned die 324 includes reconditioned die pads 332, to which 3D printed bond conductors 504 are attached.

Referring now to FIG. 6B, a diagram illustrating a rebonded reconditioned die with 3D printed bond conductors over 3D printed bond insulators 608 in accordance with the third embodiment of the present invention n is shown. After all initial 3D printed bond insulators 604 are 3D printed to surfaces of the reconditioned die 324, package base 404, and die attach adhesive 412, 3D printed bond conductors 504 are printed over the 3D printed bond insulators 604 and between the reconditioned die pads 332 and the package leads 416 or downbonds. 3D Printed bond insulators 604 and 3D printed bond conductors 504 thickness each can be less than 2 microns and is preferably 0.5-1 microns. In the preferred embodiment, 3D printed bond conductors 504 completely cover one or more reconditioned die pads 332 on the reconditioned die 324.

One of the advantages of 3D printing bond insulators 604 and bond conductors 504 is that reliable connections may be obtained by "crossing" 3D printed bond conductors 504. As is well known in the art, crossing new bond wires 344 is at least discouraged, if not forbidden, in many types of integrated circuit packages including military integrated circuits. The reason is that high shock and vibration environments may cause bond wires 344 to move slightly, which may result in short circuits and various forms of malfunction. Because 3D printed bond insulators 604 and conductors 504 are attached directly to underlying surfaces and therefore have no "free mass", they are not at risk of movement during high shock or vibration events. This then allows 3D printed bond connections to be crossed.

For example, for a non-conductive package base 404 and where underlying electrical conduction is not an issue, first 3D printed bond conductors 504 may be 3D printed as shown in FIG. 5A. After that, 3D printed bond insulators 604 may be 3D printed over ("crossing") the first 3D printed bond conductors 504. Following that, second 3D printed bond conductors 504 may be printed directly over the 3D printed bond insulators 604. In fact, several layers of such "crossings" may be performed by repeating this process for third, fourth, etc 3D printed bond conductors 504. As another example, for a conductive package base 404 where underlying electrical conduction is an issue, first 3D printed bond insulators 604 may be 3D printed as shown in FIG. 6A. Then, first 3D printed bond conductors 504 may be 3D printed over the first 3D printed bond insulators 604 as shown in FIG. 6B. After that, second 3D printed bond insulators 604 may be 3D printed over ("crossing") the first 3D printed bond conductors 504. Following that, second 3D printed bond conductors 504 may be 3D printed directly over the second 3D printed bond insulators 604. In fact, several layers of such "crossings" may be performed by repeating this process for third, fourth, etc 3D printed bond insulators 604 and 3D printed bond conductors 504.

Referring now to FIG. 6C, a diagram illustrating a rebonded and encapsulated reconditioned die 612 in accordance with the third embodiment of the present invention is shown. After all required 3D printed bond insulators 604 and 3D printed bond conductors 504 have been provided between reconditioned die pads 332 and package leads 416 or downbonds, an encapsulant compound 428 is applied within the cavity 408. The encapsulant compound 428 at least partially fills the cavity 408, and in some embodiment fully fills the cavity 408. In the preferred embodiment, the encapsulant 428 completely covers all 3D printed bond insulators 604 and 3D printed bond conductors 504. In other embodiments, the encapsulant 428 covers at least conductive areas on the top side of the reconditioned die 324, including any guard rings that may be present. In high shock and vibration environments, there may be a possibility of metallic residue flaking off and potentially contaminating the repackaged integrated circuit 616. The encapsulant 428 prevents any such flaking material from contaminating the interior of the repackaged integrated circuit 616.

Referring now to FIG. 6D, a diagram illustrating a repackaged integrated circuit 616 in accordance with the third embodiment of the present invention is shown. Following application of the encapsulant 428 to the cavity 408, the assembly at that point is considered an assembled package base 612. In some embodiments, the assembled package base 612 is vacuum baked according to the process shown in FIG. 10. In other embodiments, the assembled package base 612 is baked according to the process shown in FIG. 10, but no vacuum is applied during the baking process. In yet other embodiments, the assembled package base 612 is not baked or vacuum baked.

Following any bake or vacuum bake process, a package lid 440 is sealed to the package base 404 using a lid seal adhesive 436. In the preferred embodiment, the package base 404 is a hermetic package base 404, the package lid 440 is a hermetic package lid 440, the lid seal 436 is a hermetic solder, sealing glass, or other form of hermetic attachment able to prevent contamination of the cavity 408 by outside agents including moisture, and the die attach adhesive 412 may be a low-halide die attach adhesive 412. A low halide die attach adhesive 412 has less than 10 parts per million (ppm) halide. It has been well established that halogens in a bond interface may degrade bond strength since out-gassed products from adhesives containing halogens rapidly corrode Aluminum metallization in integrated circuits at high temperatures, thus reducing product lifetime. Hermetic packages are generally manufactured from metal, glass, or ceramic materials. In other embodiments, any of the package base 404, the package lid 440, or the lid seal adhesive 436 may be non-hermetic. Following lid seal operations, the integrated circuit is a repackaged integrated circuit 616 and ready for any hermeticity, electrical, or functional tests required.

Referring now to FIG. 7A, a flowchart illustrating a reconditioning process for an extracted die 200 in accordance with an embodiment of the present invention is shown. Although the process is shown specifically for an extracted die 200, it should be understood that the reconditioning process may also be applied to original die pads 104 of a bare die 100. Flow begins at block 704.

At block 704, a die is extracted (extracted die 200) from a packaged integrated circuit. The extracted die 200 is a fully-functional die and is shown and described in more detail with reference to FIG. 2.

At block 708, original ball bonds 208 and original bond wires 212 attached to the original ball bonds 208 are removed from the extracted die 200 by known processes. Following removal of the original ball bonds 208 and associated original bond wires 212, some metallic or chemical residues is generally on the surface of each original die pad 204. Flow proceeds to block 712.

At block 712, original die pads 204, 216 are conditioned. Any metallic and/or chemical residues are removed from each of the original die pads 204, 216 in order to prepare the original die pads 204, 216 for addition of metallic layers to create a reconditioned die 324. Removal of the residues is commonly performed using various acid washes and rinses known in the art, and as previously described. Following removal of the residues and drying the original die pads 204, 216, flow proceeds to block 716.

At block 716, an electroless Nickel (Ni) layer 316 is applied to each of the conditioned original die pads 204, 216. Application details of the electroless Nickel layer 316 were described in some detail with respect to FIG. 3C. Flow proceeds to block 720.

At block 720, an electroless Palladium (Pd) layer 320 is applied to each of the die pads 204, 216, over the electroless Nickel layer 316. Application details of the electroless Palladium layer 320 were described in some detail with respect to FIG. 3D. Flow proceeds to block 724.

At block 724, an immersion Gold (Au) layer 328 is applied to each of the die pads 204, 216, over the electroless Palladium layer 320. Application details of the immersion Gold layer 328 were described in some detail with respect to FIG. 3E. Flow ends at block 724. With the completion of adding the immersion Gold layer 328, the die is now a reconditioned die 324 ready for assembly into a package base 404.

Referring now to FIG. 7B, flowchart illustrating a reconditioning process for an extracted die 200 in accordance with another embodiment of the present invention is shown. This process converts an extracted die 200 (with original bond wires 212 and original ball bonds 208 removed) into a reconditioned die 324 of the present invention. Although the process is shown specifically for an extracted die 200, it should be understood that the reconditioning process may also be applied to original die pads 104 of a bare die 100. Flow begins at block 732.

At block 732 a die is extracted (extracted die 200) from a previous packaged integrated circuit. The previous package may be a hermetic or a non-hermetic package, and in either case is discarded and not reused. The extracted die 200 is a fully functional semiconductor die and was previously shown and described with reference to FIG. 2. Flow proceeds to block 736.

At block 736, original bond wires 212 and original ball bonds 208 are removed from the extracted die 200 by known processes. Flow proceeds to block 740.

At block 740, only original die pads 204 that had original ball bonds 208 present are conditioned, and unbonded die pads 216 are not. Any metallic and/or chemical residues are removed from each of the original die pads 204 in order to prepare the original die pads 204 for addition of metallic layers to create a reconditioned die 324. Removal of the residues is commonly performed using various acid washes and rinses known in the art. Following removal of the residues and drying the original die pads 204, flow proceeds to block 744.

At block 744, an electroless Nickel (Ni) layer 316 is applied to each of the original die pads 204. Application details of the electroless Nickel layer 316 were described in some detail with respect to FIG. 3C. Flow proceeds to block 748.

At block 748, an electroless Palladium (Pd) layer 320 is applied to each of the die pads 204, over the electroless Nickel layer 316. Application details of the electroless Palladium layer 320 were described in some detail with respect to FIG. 3D. Flow proceeds to block 752.

At block 752, an immersion Gold (Au) layer 328 is applied to each of the original die pads 204, over the electroless Palladium layer 320. Application details of the immersion Gold layer 328 were described in some detail with respect to FIG. 3E. Flow ends at block 752. With the completion of adding the immersion Gold layer 328, the die is now a reconditioned die 324 ready for assembly into a package base 404.

Referring now to FIG. 8, a diagram illustrating applying insulating and conducting material by a 3D printer in accordance with embodiments of the present invention is shown. 3D printers are able to precisely deposit insulating or conducting material on complex shapes, and are able to build up or layer the insulating or conducting material to precise thicknesses. 3D printing is also considered an additive manufacturing process, and 3D printed bond insulators 604 and 3D printed bond conductors 504 conform to the shape and texture of underlying material they are applied to.

The 3D printer includes a 3D printer material spray head 804, which applies 3D printed bond insulator 604 or conductor 504 material to selected areas of the reconditioned die 324. 3D printers typically deposit material in layers, and build up a desired thickness of material by depositing multiple layers. The 3D printer is computer controlled equipment, and sprays material according to a file or files prepared beforehand designating specific locations that material will be applied to.

In one embodiment, the 3D printer uses an extrusion process to apply the bond insulating 604 or conducting 504 material. The extrusion process, sometimes referred to as Fused Deposition Modeling (FDM) uses a heated nozzle to extrude molten material.

In another embodiment, the 3D printer uses a Colorjet Printing (CJP) process to apply the bond insulating 604 or conducting 504 material. The CJP process utilizes an inkjet-based technology to spread fine layers of a dry substrate material. The dry substrate is most often in a powder form. The inkjet applies a binder to the substrate after applying the dry substrate material in order to solidify and cure the dry substrate.

In the preferred embodiment, the 3D printer uses a selective laser sintering process. The 3D printed insulating 604 or conducting 504 material is applied in powder form to desired areas.

The 3D printed bond insulator 604 material is a material able to be applied in powder form or extruded, and is generally a polymer or plastic. However, any material having suitable insulation properties, able to adhere to the reconditioned die 324, package base 404, and die attach adhesive 412, and able to be applied with a 3D printer material spray head 804 is suitable as 3D bond insulator 604 material.

The 3D printed bond conductor 504 material is also a material able to be applied in powder form or extruded, and includes at least conductive metal and possibly polymer or plastic content in order to provide elastomeric or resilient properties. In the preferred embodiment, the metal content includes silver. In other embodiments, the material may include alone or in combination gold, aluminum, or copper.

A sintering process is a second step of the 3D printing process used in the preferred embodiment of the invention, but is not specifically illustrated. A laser aims a laser beam at the applied bond insulating or conducting 504 material to convert the applied material into 3D printed bond insulators 604 or 3D printed bond conductors 504, respectively. The laser beam converts the powder form applied material into a molten compound with liquid properties that forms a smooth solid compound when it cools. The smooth solid compound is either 3D printed bond insulators 604 or 3D printed bond conductors 504.

Referring now to FIG. 9A, a flowchart illustrating an assembly process for a repackaged integrated circuit 432 in accordance with embodiments of the present invention is shown. Flow begins at block 904.

At block 904, a reconditioned die 324 is secured to a package base 404. In the preferred embodiment, the package base 404 is a hermetic package base. In some embodiments, the reconditioned die 324 is secured to a package base 404 with a die attach adhesive 412. In other embodiments, the reconditioned die 324 is secured to a package base 404 with a low-halide content die attach adhesive 412. Flow proceeds to block 908.

At block 908, new bond wires 344 with new ball bonds 340 are provided between reconditioned die pads 332 of the reconditioned die 324 and package leads 416 or downbonds. The new bond wires 344 with new ball bonds 340 may be provided by any suitable wire bonding processes, including but not limited to thermosonic bonding or wedge bonding. Flow proceeds to block 912.

At block 912, an encapsulant compound 428 is applied within a cavity 408 of the package base 404. The encapsulant compound 428 at least partially fills the cavity 408, and in some embodiment fully fills the cavity 408. In one embodiment, the encapsulant 428 is an epoxy suitable for hermetic or non-hermetic applications (depending on whether the repackaged integrated circuit 432, 512, 616 is hermetic or non-hermetic). In another embodiment, the encapsulant 428 is a resilient silicone compound suitable for hermetic or non-hermetic applications (depending on whether the repackaged integrated circuit 432, 512, 616 is hermetic or non-hermetic). In one embodiment, the encapsulant 428 covers at least the new ball bonds 340 and any guard rings on the reconditioned die 324. In another embodiment, the encapsulant 428 covers all new bond wires 344 in addition to all new ball bonds 340 and any guard rings on the reconditioned die 324. Flow proceeds to optional block 916 and block 920.

At optional block 916, the assembled package base 424 may be vacuum baked in order to cure the encapsulant 428 and eliminate residual air pockets and moisture within the cavity 408. Any suitable vacuum bake process known in the art may be used to cure the encapsulant 428, and manufacturer instructions for curing the encapsulant 428 should in all cases be followed. One alternative vacuum bake process is illustrated and described with respect to FIG. 10. Flow proceeds to block 920.

At block 920, a package lid 440 is sealed to the assembled package base 424. Sealing the package lid 440 to the package base 404 produces a repackaged integrated circuit 432. In most embodiments, a lid deal adhesive 436 known in the art is used. For hermetic applications requiring a hermetic package lid 440 and a hermetic package base 404, the lid deal adhesive is suitable for the packaging materials used—for example a suitable solder compound for metallic packages or a hermetic lid sealing glass for glass or ceramic packages. Flow proceeds to optional block 924 and block 928.

At optional block 924, the repackaged integrated circuit 432 is tested for hermeticity per MIL-SPEC-883H. Hermeticity tests the integrity of the package to outside contamination due to either air or moisture leaks. Flow proceeds to block 928.

At block 928, the repackaged integrated circuit 432 is electrically tested. Electrical testing includes either continuity tests or functional tests, or both. Flow ends at block 928.

Referring now to FIG. 9B, a flowchart illustrating an assembly process for a repackaged integrated circuit 512, 616 in accordance with other embodiments of the present invention is shown. Flow begins at block 950.

At block 950, a reconditioned die 324 is secured to a package base 404. In the preferred embodiment, the package base 404 is a hermetic package base. In some embodiments, the reconditioned die 324 is secured to a package base 404 with a die attach adhesive 412. In other embodiments, the reconditioned die 324 is secured to a package base 404 with a low-halide content die attach adhesive 412. Flow proceeds to optional block 954 and block 958.

At optional block 954, if there are conductive surfaces on the reconditioned die 324 or package base 404 that need to be bridged with an insulator, a 3D printer 3D prints bond insulators 604 between reconditioned die pads 332 and package leads 416. For example, if package base 404 is a metallic and electrically conductive hermetic package base, 3D printed bond insulators 604 should be 3D printed on surfaces of the package base 404 between the reconditioned die pads 332 and the package leads 416. Optional block 954 is not required if there are no conductive traces or other conductive surfaces that must be bridged prior to application of 3D printed bond conductors 504. Flow proceeds to block 958.

At block 958, a 3D printer prints bond conductors 504 connecting reconditioned die pads 332 to package leads 416 or downbonds. If 3D printed bond insulators 604 were provided in optional block 954, the width of 3D printed bond conductors 504 should be controlled in order to be narrower than the width of 3D printed bond insulators 604 in order to prevent short-circuiting between 3D printed bond conductors 504 and other metallic traces or surfaces. Flow proceeds to block 962.

At block 962, an encapsulant compound 428 is applied within a cavity 408 of the package base 404. The encapsulant compound 428 at least partially fills the cavity 408, and in some embodiment fully fills the cavity 408. In one embodiment, the encapsulant 428 is an epoxy suitable for hermetic or non-hermetic applications (depending on whether the repackaged integrated circuit 432, 512, 616 is hermetic or non-hermetic). In another embodiment, the encapsulant 428 is a resilient silicone compound suitable for hermetic or non-hermetic applications (depending on whether the repackaged integrated circuit 432, 512, 616 is hermetic or non-hermetic). The encapsulant 428 exhibits low thermal expansion, meaning in the expected operating environment temperatures, the encapsulant will not increase in volume to a degree to place internal pressure on the package base 404, package lid 440, or lid seal compound 436. The encapsulant 428 at least covers the 3D printed bond conductors 504 and any guard rings on the reconditioned die 324. Flow proceeds to optional block 966 and block 970.

At optional block 966, the assembled package base 508, 612 may be vacuum baked in order to cure the encapsulant 428 and eliminate residual air pockets and moisture within the cavity 408. Any suitable vacuum bake process known in the art may be used to cure the encapsulant 428, and manufacture instructions for curing the encapsulant 428 should in all cases be followed. One alternative vacuum bake process is illustrated and described with respect to FIG. 10. Flow proceeds to block 970.

At block 970, a package lid 440 is sealed to the assembled package base 508, 612. Sealing the package lid 440 to the package base 404 creates a repackaged integrated circuit 512, 616. In most embodiments, a lid deal adhesive 436 known in the art is used. For hermetic applications requiring a hermetic package lid 440 and a hermetic package base 404, the lid deal adhesive 436 is suitable for the packaging materials used—for example a suitable solder compound for metallic packages or a hermetic lid sealing glass for glass or ceramic packages. Flow proceeds to optional block 974 and block 978.

At optional block 974, the repackaged integrated circuit 512, 616 is tested for hermeticity per MIL-SPEC-883H. Hermeticity tests the integrity of the package to outside contamination due to either air or moisture leaks. Flow proceeds to block 978.

At block 978, the repackaged integrated circuit 512, 616 is electrically tested. Electrical testing includes either continuity tests or functional tests, or both. Flow ends at block 978.

Referring now to FIG. 10, a flowchart illustrating a vacuum bake process 916, 966 in accordance with embodiments of the present invention is shown. The vacuum bake process is illustrative of many alternative vacuum baking processes known in the semiconductor arts, and it should be understood that other alternative vacuum bake processes may be used with equivalent success. Flow begins at block 1004.

At block 1004, prior to hermetic encapsulation (illustrated and described with reference to FIG. 7E), the assembled package base 424, 508, 612 (reflecting an assembly level shown and described as in FIGS. 4C, 5B, and 6C, respectively) is placed into a vacuum/pressure furnace. The vacuum/pressure furnace is equipment designed to present a predetermined thermal profile to one or more integrated circuits at a fixed or varying atmospheric pressure profile. Examples of vacuum/pressure furnaces are models 3130, 3140, and 3150 produced by Scientific Sealing Technologies International (SST). Flow proceeds to block 1008.

At block 1008, the internal temperature of the vacuum/pressure furnace is adjusted to a temperature of 200° C. or more. Flow proceeds to block 1012.

At block 1012, a baking timer is started. The baking timer measures elapsed time the assembled package base 424, 508, 612 is baking in the vacuum/pressure furnace. Flow proceeds to decision block 1016.

At decision block 1016, the baking timer is evaluated to determine if the assembled package base 424, 508, 612 has been baking for one hour, or more. If the assembled package base 424, 508, 612 has not been baking for at least one hour, then flow proceeds to decision block 1016 to wait until at least one hour of baking time has elapsed. In a first embodiment, if the assembled package base 424, 508, 612 has been baking for at least one hour, then flow proceeds to block 1024. In a second embodiment, if the assembled package base 424, 508, 612 has been baking for at least one hour, then flow proceeds to optional decision block 1020.

At optional decision block 1020, the vacuum/pressure furnace is evaluated to determine if a baking pressure of 20 milliTorr (mTorr) or less has been reached. Vacuum/pressure furnaces reduce the baking pressure from atmospheric (i.e., 1 atm) to pressures which can be orders of magnitude less than atmospheric pressure. Initially, the pressure is reduced rapidly, and later on, the pressure slowly decreases. Therefore, the specified target pressure (20 mTorr) is usually reached near the end of the baking time. If a baking pressure of 20 mTorr or less has not been reached, the flow proceeds to block 1020 to wait until at least a baking pressure of 20 mTorr or less has been reached. If a baking pressure of 20 mTorr or less has been reached, the flow proceeds to block 1024.

At block 1024, the assembled package base 424, 508, 612 is removed from the vacuum/pressure furnace. The vacuum baking process is now completed. Flow proceeds to block 920 of FIG. 9A and block 970 of FIG. 9B.

Finally, those skilled in the art should appreciate that they can readily use the disclosed conception and specific embodiments as a basis for designing or modifying other structures for carrying out the same purposes of the present invention without departing from the spirit and scope of the invention as defined by the appended claims.

It will be readily understood that the components of the application, as generally described and illustrated in the figures herein, may be arranged and designed in a wide variety of different configurations. Thus, the detailed description of the embodiments is not intended to limit the scope of the application as claimed, but is merely representative of selected and exemplary embodiments of the application.

One having ordinary skill in the art will readily understand that the application as discussed above may be practiced with steps in a different order, and/or with hardware elements in configurations that are different than those which are specifically disclosed. Therefore, although the application has been described based upon these preferred embodiments, it would be apparent to those of skill in the art that certain modifications, variations, and alternative constructions would be apparent, while remaining within the spirit and scope of the application. In order to determine the metes and bounds of the application, therefore, reference should be made to the present claims.

While preferred embodiments of the present application have been described, it is to be understood that the embodiments described are illustrative only and the scope of the application is to be defined solely by the appended claims when considered with a full range of equivalents and modifications (e.g., protocols, hardware devices, software platforms etc.) thereto.

I claim:

1. A method comprising:
   removing one or more existing ball bonds from an extracted die, the extracted die comprising a fully functional semiconductor die removed from a previous package;
   reconditioning die pads of the extracted die to create a reconditioned die, reconditioning comprising applying a plurality of metallic layers to the die pads;
   securing the reconditioned die within a cavity of a new package base;
   providing a plurality of bond connections interconnecting the reconditioned die pads and package leads or downbonds of the new package base;
   applying an encapsulating compound over the reconditioned die and the plurality of bond connections to create an assembled package base, the encapsulating compound configured to exhibit low thermal expansion; and
   securing a lid to the new package base.

2. The method of claim 1, wherein the plurality of bond connections comprises new bond wires and new bonds.

3. The method of claim 2, wherein the encapsulating compound completely covers the new bond wires and the new bonds.

4. The method of claim 1, wherein providing the plurality of bond connections comprises:
   3D printing, by a 3D printer, a plurality of 3D printed bond connections, each comprising a 3D printed bond conductor.

5. The method of claim 1, wherein providing the plurality of bond connections comprises:
   3D printing, by a 3D printer, one or more 3D printed bond insulators at least to conductive surfaces of the reconditioned die and new package base between reconditioned die pads and one or more package leads; and
   3D printing, by the 3D printer, one or more 3D printed bond conductors over the one or more 3D printed bond insulators, the one or more 3D printed bond conductors providing electrical conduction between the reconditioned die pads and package leads or downbonds of the new package base, the one or more 3D printed bond insulators preventing electrical conduction between the one or more 3D printed bond conductors and conductive surfaces of the reconditioned die and new package base.

6. The method of claim 1, wherein in response to applying the encapsulating compound, the method further comprising:
   vacuum baking the assembled package base.

7. The method of claim 1, wherein the encapsulating compound comprises one of an epoxy or silicone.

8. The method of claim 1, wherein in response to removing the one or more existing ball bonds from the extracted die and prior to reconditioning the die pads:
   removing metallic and chemical residues from die pads of the extracted die to create conditioned die pads.

9. The method of claim 8, wherein applying the plurality of metallic layers comprising:
   adding a layer of nickel to the conditioned die pads;
   adding a layer of palladium over the layer of nickel; and
   adding a layer of gold over the layer of palladium.

10. The method of claim 1, wherein the lid comprises a hermetic lid and the new package base comprises a hermetic package base, wherein sealing the lid to the new package base produces a hermetic packaged integrated circuit.

11. A packaged integrated circuit, comprising:
    a reconditioned die, comprising:
       an extracted die with original ball bonds removed and reconditioned die pads, the extracted die comprising a fully functional semiconductor die removed from a previous package and comprising the original ball bonds, reconditioned die pads comprising a plurality of metallic layers applied to die pads of the extracted die;
    a new package base comprising package leads and a cavity, the reconditioned die secured within the cavity;

a plurality of bond connections interconnecting the reconditioned die pads and the package leads or downbonds of the new package base;

an encapsulating compound applied over the reconditioned die and the plurality of bond connections to create an assembled package base, the encapsulating compound configured to exhibit low thermal expansion; and a lid, secured to the assembled package base.

12. The packaged integrated circuit of claim 11, wherein the plurality of bond connections comprises new bond wires and new bonds.

13. The packaged integrated circuit of claim 12, wherein the encapsulating compound completely covers the new bond wires and the new bonds.

14. The packaged integrated circuit of claim 11, wherein the plurality of bond connections comprises a plurality of 3D printed bond connections, each comprising a 3D printed bond conductor.

15. The packaged integrated circuit of claim 11, wherein the plurality of bond connections comprises:

one or more 3D printed bond insulators, configured to at least cover conductive surfaces of the reconditioned die and new package base between the reconditioned die pads and one or more package leads; and one or more 3D printed bond conductors applied over the one or more 3D printed bond insulators, the one or more 3D printed bond conductors providing electrical contact between the reconditioned die pads and package leads or downbonds of the new package base, the one or more 3D printed bond insulators preventing electrical conduction between the one or more 3D printed bond conductors and conductive surfaces of the reconditioned die and new package base.

16. The packaged integrated circuit of claim 11, wherein the assembled package base is vacuum baked to remove moisture prior to securing the lid.

17. The packaged integrated circuit of claim 11, wherein the encapsulating compound comprises one of an epoxy or silicone.

18. The packaged integrated circuit of claim 11, wherein in response to removing the original ball bonds from the extracted die and prior to reconditioning the die pads, the die pads being conditioned by removing metallic and chemical residues from die pads of the extracted die.

19. The packaged integrated circuit of claim 18, wherein the plurality of metallic layers comprising:

a layer of nickel applied over the conditioned die pads;

a layer of palladium applied over the layer of nickel; and a layer of gold applied over the layer of palladium.

20. The packaged integrated circuit of claim 11, wherein the lid comprises a hermetic lid and the new package base comprises a hermetic package base, the packaged integrated circuit being hermetic.

\* \* \* \* \*